United States Patent
Komatsu

(10) Patent No.: US 11,735,265 B2
(45) Date of Patent: Aug. 22, 2023

(54) NONVOLATILE SEMICONDUCTOR MEMORY DEVICE AND OPERATING METHOD THEREOF

(71) Applicant: Kioxia Corporation, Tokyo (JP)

(72) Inventor: Yukio Komatsu, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 188 days.

(21) Appl. No.: 17/400,330

(22) Filed: Aug. 12, 2021

(65) Prior Publication Data

US 2022/0262440 A1    Aug. 18, 2022

(30) Foreign Application Priority Data

Feb. 16, 2021 (JP) .................................. 2021-022542

(51) Int. Cl.
| | | |
|---|---|---|
| *G11C 16/04* | (2006.01) | |
| *G11C 16/08* | (2006.01) | |
| *G11C 29/44* | (2006.01) | |
| *G11C 11/56* | (2006.01) | |

(52) U.S. Cl.
CPC .......... *G11C 16/08* (2013.01); *G11C 11/5628* (2013.01); *G11C 29/44* (2013.01); *G11C 16/0483* (2013.01)

(58) Field of Classification Search
CPC ..... G11C 16/0483; G11C 16/08; G11C 16/24; G11C 16/26; G11C 11/5628; G11C 29/44
See application file for complete search history.

(56) References Cited

U.S. PATENT DOCUMENTS

| | | | | |
|---|---|---|---|---|
| 7,978,513 | B2 | 7/2011 | Kasuga | |
| 8,526,241 | B2 | 9/2013 | Shirakawa | |
| 10,008,270 | B2* | 6/2018 | Lee | G11C 16/24 |
| 10,937,502 | B2* | 3/2021 | Hashimoto | G11C 16/30 |
| 2011/0007572 | A1* | 1/2011 | Ueno | G11C 11/5628 |
| | | | | 365/185.22 |
| 2013/0286742 | A1 | 10/2013 | Komine et al. | |
| 2022/0301630 | A1* | 9/2022 | Nakano | G11C 16/08 |
| 2023/0088312 | A1* | 3/2023 | Date | G11C 16/08 |

FOREIGN PATENT DOCUMENTS

| | | | |
|---|---|---|---|
| JP | 2012155788 A | 8/2012 | |
| JP | 5223869 B2 | 3/2013 | |
| JP | 5377526 B2 | 12/2013 | |

* cited by examiner

*Primary Examiner* — Hien N Nguyen
(74) *Attorney, Agent, or Firm* — Holtz, Holtz & Volek PC

(57) ABSTRACT

According to a certain embodiment, the nonvolatile semiconductor memory device includes: a memory cell array including a plurality of selected blocks and a plurality of non-selected blocks; and a row decoder including a block decoder configured to switch between the selected block and the non-selected block. The row decoder switches a block determined to be a defective block to a non-selected block and switches a block determined not to be a defective block to a selected block, on the basis of the multi-level data. The block decoder includes a defective block flag circuit including a plurality of latch circuits configured to store multi-level data.

20 Claims, 21 Drawing Sheets

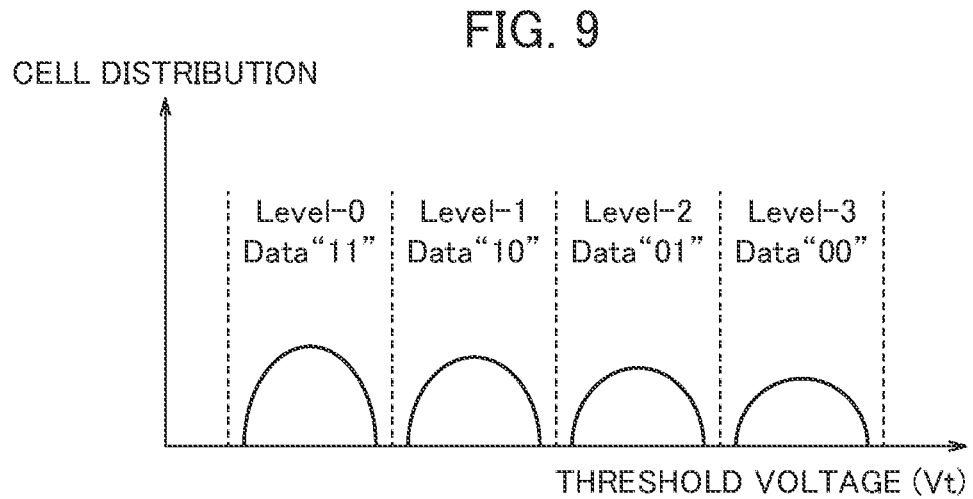

| BLOCK ADDRESS | DEFECTIVE BLOCK FLAG | | |
|---|---|---|---|
| | C | B | A |
| BLK0 | 0 | 0 | 0 |
| BLK1 | 0 | 0 | 1 |
| BLK2 | 0 | 1 | 0 |
| BLK3 | 0 | 1 | 1 |
| BLK4 | 1 | 0 | 0 |
| BLK5 | 1 | 0 | 1 |
| BLK6 | 1 | 1 | 0 |
| BLK7 | 1 | 1 | 1 |
| ⋮ | ⋮ | ⋮ | ⋮ |

FIG. 18

| DEFECTIVE BLOCK FLAG | | | DETERMINATION |
|---|---|---|---|
| C | B | A | |
| 0 | 0 | 0 | COMPLETELY NORMAL |
| 0 | 0 | 1 | AVAILABLE AS C |
| 0 | 1 | 0 | AVAILABLE AS B |
| 0 | 1 | 1 | AVAILABLE AS C |
| 1 | 0 | 0 | FAILURE |
| 1 | 0 | 1 | FAILURE |
| 1 | 1 | 0 | FAILURE |
| 1 | 1 | 1 | COMPLETELY FAILURE |

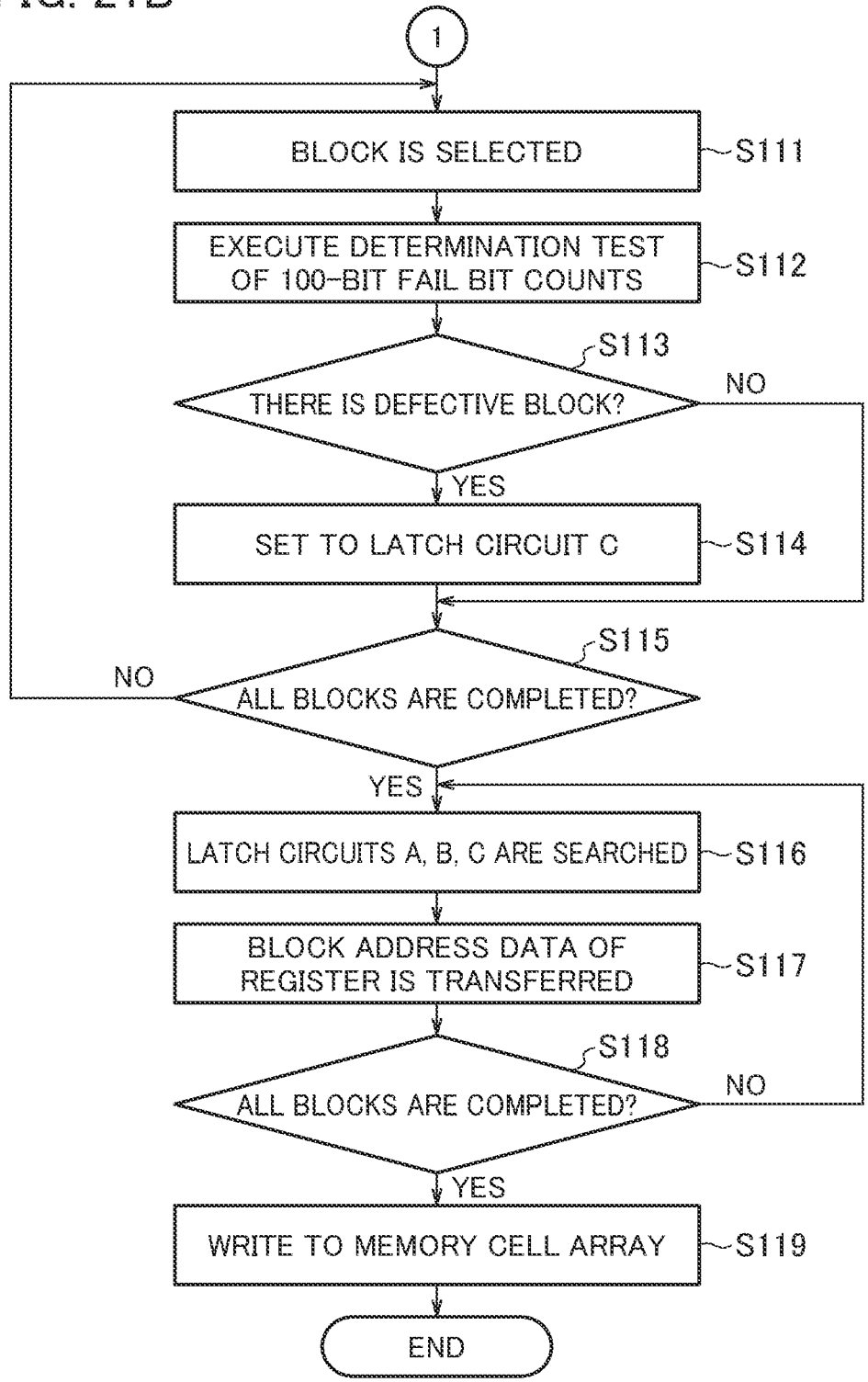

FIG. 22

| DEFECTIVE BLOCK FLAG | | | DETERMINATION |
|---|---|---|---|
| C | B | A | |
| 0 | 0 | 0 | COMPLETELY NORMAL |
| 0 | 0 | 1 | AVAILABLE AS B |
| 0 | 1 | 0 | AVAILABLE AS A |
| 0 | 1 | 1 | FAILURE |
| 1 | 0 | 0 | FAILURE |
| 1 | 0 | 1 | FAILURE |
| 1 | 1 | 0 | FAILURE |
| 1 | 1 | 1 | COMPLETELY FAILURE |

னான்VOLATILE SEMICONDUCTOR MEMORY DEVICE AND OPERATING METHOD THEREOF

CROSS REFERENCE TO RELATED APPLICATIONS

This application is based upon and claims the benefit of priority from prior Japanese Patent Application No. P2021-022542 filed on Feb. 16, 2021, the entire contents of which are incorporated herein by reference.

FIELD

Embodiments described herein relate generally to a nonvolatile semiconductor memory device and an operating method thereof.

BACKGROUND

NAND flash memories as one type of semiconductor memory devices have been known. In the NAND flash memories, it has been known that when there is a defective block, it is configured to prevent a word line belonging to corresponding logical block from being driven.

BRIEF DESCRIPTION OF THE DRAWINGS

FIG. 9 is a schematic diagram illustrating a relationship between a cell distribution and a threshold of an MLC type memory cell.

FIG. 10 is a diagram illustrating an example of a table of a defective block address map according to the first embodiment.

FIG. 11 is a diagram illustrating an example of a relationship between defective block flag information and a determination according to the first embodiment.

FIG. 18 is a diagram illustrating an example of a relationship between defective block flag information and a determination according to the second embodiment.

FIG. 21B is a flow chart illustrating an operation example of the determination test of 10-bit, 50-bit, and 100-bit fail bit counts according to the third embodiment. (Phase 2)

FIG. 22 is a diagram illustrating an example of a relationship between defective block flag information and a determination according to the third embodiment.

DETAILED DESCRIPTION

Next, certain embodiments will now be described with reference to the drawings. In the description of the following drawings to be explained, the identical or similar reference sign is attached to the identical or similar part. However, the drawings are merely schematic.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

In the following description, pass/fail information and tPROG NG block information of various cell tests, such as a Single-Level Cell (SLC), a Multi-Level Cell (MLC), a Triple-Level Cell (TLC), and a Quad-Level Cell (QLC), may simplify be as SLC, MLC, TLC, QLC, and tPROG.

Certain embodiments provide a nonvolatile semiconductor memory device capable of improving a yield of a memory cell array by enabling use of a non-selected block including a defective block, on the basis of multi-level data.

According to one embodiment, a nonvolatile semiconductor memory device includes: a memory cell array including a plurality of selected blocks and a plurality of non-selected blocks; and a row decoder including a block decoder configured to switch between the selected block and the non-selected block. The block decoder includes a defective block flag circuit including a plurality of latch circuits configured to store multi-level data. The block decoder switches a block determined to be a defective block to a non-selected block and switches a block determined not to be a defective block to a selected block, on the basis of the multi-level data.

EMBODIMENTS (Memory System)

Figure 1:
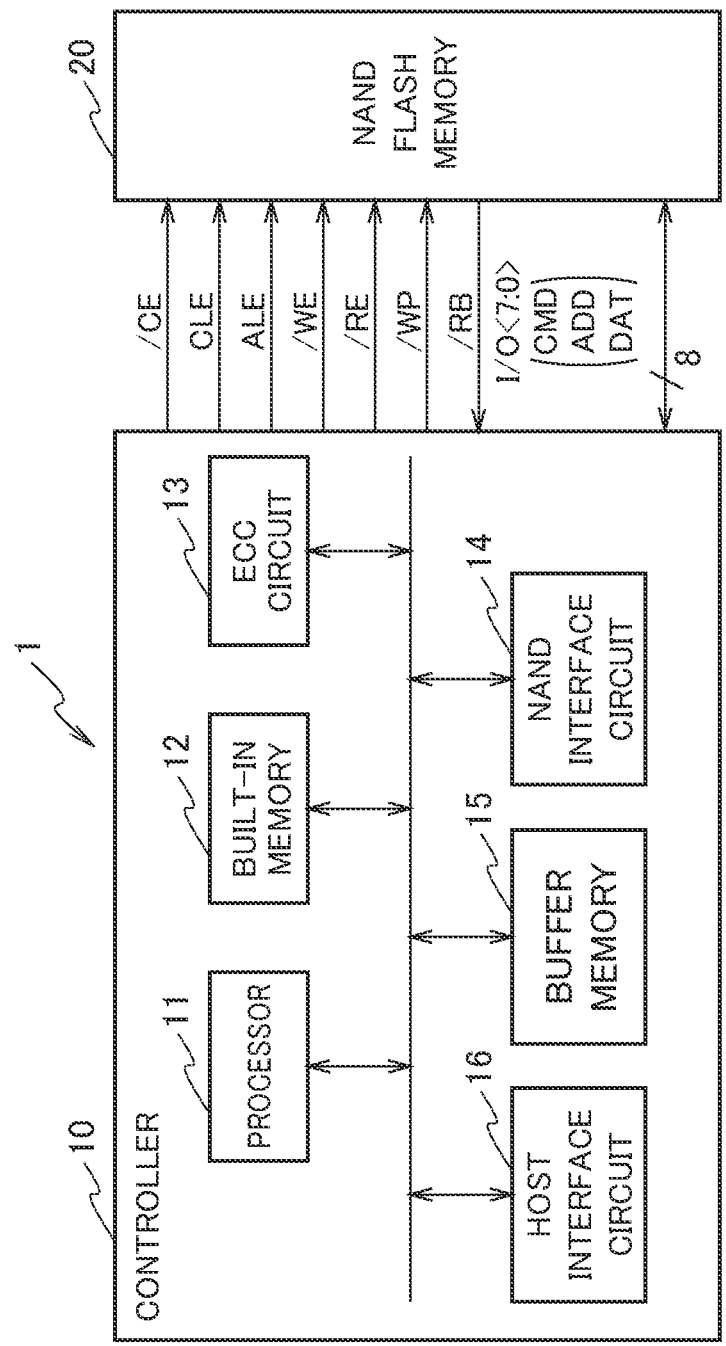
FIG. 1 is a diagram illustrating a block structural example of a memory system to which a nonvolatile semiconductor memory device according to embodiments is applied.

FIG. 1 illustrates an example of a block configuration of a memory system 1 to which a nonvolatile semiconductor memory device 20 according to the embodiments is applied.

The memory system 1 communicates with an external host device(s), for example. The memory system 1 stores data from a host device (not illustrated), and reads out data to the host device.

As illustrated in FIG. 1, the memory system 1 includes a controller 10 and a nonvolatile semiconductor memory device (e.g., NAND flash memory) 20. The controller 10 receives a command from the host device and controls the nonvolatile semiconductor memory device 20 on the basis of the received command. More specifically, the controller 10 writes data instructed to be written by the host device into the nonvolatile semiconductor memory device 20, and reads data instructed to be read by the host device from the nonvolatile semiconductor memory device 20 and transmits the read data to the host device. The controller 10 is connected to the nonvolatile semiconductor memory device 20 through a NAND bus. The nonvolatile semiconductor memory device 20 includes a plurality of memory cells and stores data in a nonvolatile manner.

The NAND bus transmits and receives signals /CE, CLE, ALE, /WE, /RE, /WP, /RB, and I/O<7:0> according to a NAND interface standard via individual wirings. The signal /CE is a signal for enabling the nonvolatile semiconductor memory device 20. The signal CLE notifies the nonvolatile semiconductor memory device 20 that the signal I/O<7:0> to be fed to the nonvolatile semiconductor memory device 20 includes a command while the signal CLE is at a "H (High)" level. The signal ALE is a signal for notifying the nonvolatile semiconductor memory device 20 that the signal I/O <7:0> to be fed to the nonvolatile semiconductor memory device 20 includes an address while the signal ALE is at the "H" level. The signal /WE is a signal for instructing the nonvolatile semiconductor memory device 20 to buffer the signal I/O to be fed to the nonvolatile semiconductor memory device 20 while the signal /WE is at a "L (Low)" level. The signal /RE is a signal for instructing the nonvolatile semiconductor memory device 20 to provide the signal I/O<7:0>. The signal /WP is a signal for instructing the nonvolatile semiconductor memory device 20 to prohibit writing and erasing of data. The signal /RB indicates whether the nonvolatile semiconductor memory device 20 is in a ready state (i.e., a state where reception of an instruction from the outside is accepted) or a busy state (i.e., a state where reception of an instruction from the outside is not accepted). The signal I/O<7:0> is, for example, an 8-bit signal. The signal I/O<7:0> is a substance of data transmitted and received between the nonvolatile semiconductor memory device 20 and the controller 10, and may include a command CMD, an address ADD, and data DAT. The data DAT includes write data and read data.

As illustrated in FIG. 1, the controller 10 includes a processor (e.g., Central Processing Unit (CPU)) 11, a built-in memory (e.g., Random Access Memory (RAM)) 12, an Error Check and Correction (ECC) circuit 13, a NAND interface circuit 14, a buffer memory 15, and a host interface circuit 16.

The processor 11 controls the overall operation of the controller 10. The processor 11 issues a read instruction based on the NAND interface standard to the nonvolatile semiconductor memory device 20, for example, in response to a data read instruction received from the host device. This operation also applies to a case of writing or erasing of data. Moreover, the processor 11 includes a function of executing various operations on read data from the nonvolatile semiconductor memory device 20.

The built-in memory 12 is, for example, a semiconductor memory such as a dynamic RAM (DRAM) and is used as a work area of the processor 11. The built-in memory 12 stores firmware, various management tables, and the like for managing the nonvolatile semiconductor memory device 20.

The ECC circuit 13 executes error detection and error correction processing. More specifically, when data is written, an ECC code is generated for each set including a certain number of pieces of data on the basis of data received from the host device. Moreover, when data is read out, ECC decoding is executed on the basis of the ECC code to detect the presence or absence of an error. Then, when an error is detected, a bit position where the error is detected is specified to correct the error.

The NAND interface circuit 14 is connected to the nonvolatile semiconductor memory device 20 through the NAND bus, and manages communication with the nonvolatile semiconductor memory device 20. In response to an instruction of the processor 11, the NAND interface circuit 14 transmits the command CMD, the address ADD, and write data to the nonvolatile semiconductor memory device 20. Moreover, the NAND interface circuit 14 also receives read data from the nonvolatile semiconductor memory device 20.

The buffer memory 15 temporarily stores data and the like received by the controller 10 from the nonvolatile semiconductor memory device 20 and the host device. The buffer memory 15 is also used, for example, as a storage area for temporarily stores read data from the nonvolatile semiconductor memory device 20, an operation result on read data, and the like.

The host interface circuit 16 is connected to the host device and manages the communication with the host device. The host interface circuit 16 transfers respectively, for example, an instruction and data received from the host device to the processor 11 and the buffer memory 15.

(Configuration of Nonvolatile Semiconductor Memory Device)

Figure 2:
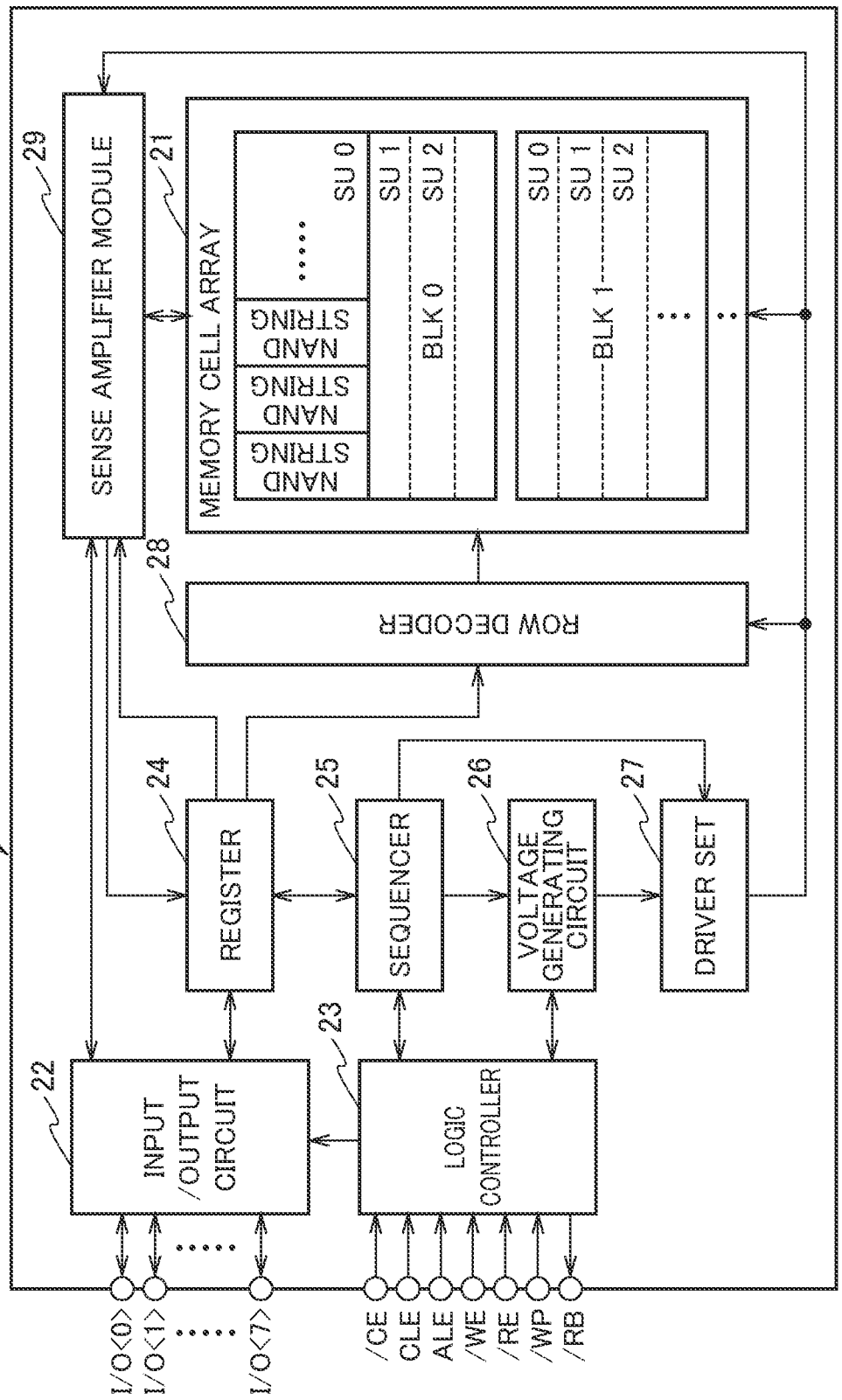
FIG. 2 is a diagram illustrating a block structural example of the nonvolatile semiconductor memory device according to the embodiments.

FIG. 2 illustrates an example of a block configuration of the nonvolatile semiconductor memory device 20 according to the embodiments. As illustrated in FIG. 2, the nonvolatile semiconductor memory device 20 according to the embodiments includes a memory cell array 21, an input/output (I/O) circuit 22, a logic controller 23, a register 24, a sequencer 25, a voltage generating circuit 26, a driver set 27, a row decoder 28, and a sense amplifier module 29.

The memory cell array 21 includes a plurality of blocks BLK (BLK0, BLK1, . . . ). The block BLK includes a plurality of nonvolatile memory cell transistors associated with word lines and bit lines. The block BLK is an erasing unit of data, and data in the same block BLK is collectively erased, for example. Each block BLK includes a plurality of string units SU (SU0, SU1, SU2, . . . ). Each string unit SU is a set of NAND strings NS. The NAND string NS includes a plurality of memory cell transistors. Hereinafter, the memory cell transistor may also be simply referred to as a "cell." The number of blocks in the memory cell array 21, the number of string units in one block BLK, and the number of NAND strings in one string unit SU can be set to any number.

The input and output circuit 22 transmits and receives the signal I/O<7:0> to and from the controller 10. The input and output circuit 22 transfers the command CMD and the address ADD in the signal I/O<7:0> to the register 24. The input and output circuit 22 transmits and receives write data and read data to and from the sense amplifier module 29.

The logic control circuit 23 receives the signals /CE, CLE, ALE, /WE, /RE, and /WP from the controller 10. The logic control circuit 23 transfers the signal /RB to the controller 10 and notifies a state of the nonvolatile semiconductor memory device 20 to the outside.

The register 24 stores the command CMD and the address ADD. The register 24 transfers the address ADD to the row decoder 28 and the sense amplifier module 29 and transfers the command CMD to the sequencer 25.

The sequencer 25 receives the command CMD and controls the entire nonvolatile semiconductor memory device 20 in accordance with a sequence based on the received command CMD.

The voltage generating circuit 26 generates a voltage necessary for operations such as writing, reading, and erasing of data on the basis of an instruction from the sequencer 25.

The voltage generating circuit 26 supplies the generated voltage to the driver set 27.

The driver set 27 includes a plurality of drivers and supplies various voltages from the voltage generating circuit 26 to the row decoder 28 and the sense amplifier module 29 on the basis of the address from the register 24. The driver set 27 supplies various voltages to the row decoder 28 on the basis of a row address in the address, for example.

The row decoder 28 receives the row address in the address ADD from the register 24, and selects the block BLK or the like on the basis of a block address in the aforementioned row address, for example. The voltage from the driver set 27 is transferred to the selected block BLK through the row decoder 28.

When reading data, the sense amplifier module 29 senses the read data which is read from the memory cell transistor to the bit line, and transfers the sensed read data to the I/O circuit 22. When writing data, the sense amplifier module 29 transfers the write data to be written through the bit lines to the memory cell transistor. Moreover, the sense amplifier module 29 receives a column address in the address ADD from the register 24, and outputs column data based on the column address.

(Circuit Configuration Example of Memory Cell Array)

Figure 3:
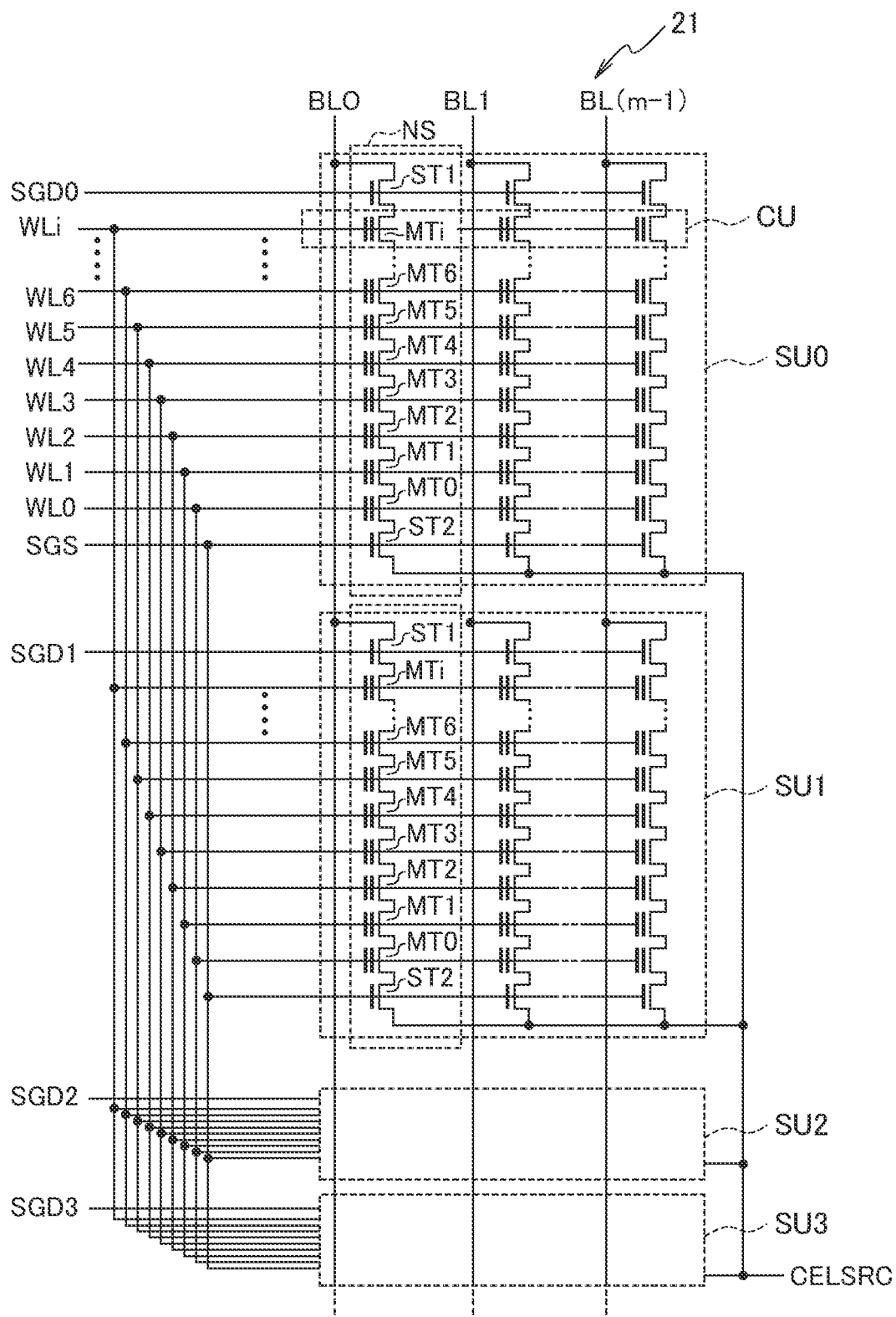
FIG. 3 is a diagram illustrating an example of a circuit configuration of a memory cell array according to the embodiments.

FIG. 3 illustrates a circuit configuration example of a memory cell array 21 in the nonvolatile semiconductor memory device 20 according to the embodiments. As illustrated in FIG. 3, each of the NAND strings NS includes, for example, i (where i is a natural number) pieces of memory cell transistors MT (i.e., MT0 to MTi), a select transistor ST1, and a select transistor ST2. The number i of the memory cell transistors MT may be, for example, 8, 16, 32, 64, 96, 128 or the like, and the number thereof is not limited thereto. The memory cell transistor MT includes a stacked gate structure including a control gate and a charge storage layer. Moreover, the memory cell transistor MT may include a stacked gate structure including a control gate and a floating gate. Each memory cell transistor MT is connected in series between the select transistors ST1 and ST2. In the following description, the term "connection" used herein also includes a case where another electrically conductive element is interposed between elements.

In a certain block BLK, gates of the select transistors ST1 of string units SU0 to SU3 are respectively connected to select gate lines SGD0 to SGD3. Control gates of the memory cell transistors MT0 to MTi in the same block BLK respectively are connected to the word lines WL0 to WLi. That is, the word line WL of the same address is commonly connected to all the string units SU in the same block BLK. On the other hand, a select gate line SGD is connected to one of the string units SU in the same block BLK.

Moreover, among the NAND strings NS arranged in a matrix in the memory cell array 21, the other end of the select transistor ST1 of the NAND string NS in the same row is connected to one of m bit lines BL (BL0 to BL(m−1) (where m is a natural number)). Moreover, the bit line BL is commonly connected to the NAND string NS of the same column across the plurality of blocks BLK.

Moreover, the other end of the select transistor ST2 is connected to a source line CELSRC. The source line CELSRC is commonly connected to the plurality of NAND strings NS across the plurality of blocks BLK.

Data erasing is executed collectively with respect to the memory cell transistors MT in the same block BLK. In contrast, reading and writing of data is executed collectively with respect to the plurality of memory cell transistors MT commonly connected to any of the word lines WL, in any of the string units SU of any block BLK. Such a set including memory cell transistors MT sharing the word line WL in one string unit SU is referred to as a cell unit CU. The cell unit CU is a set including the memory cell transistors MT for which write operations or read operations can be collectively executed.

In addition, one memory cell transistor MT can store a plurality of pieces of bit data, for example. In the same cell unit CU, a set including one bit held at the same bit position by each memory cell transistor MT is called a "page." The "page" used herein is defined as a portion of memory space formed in a set including the memory cell transistors MT in the same cell unit CU.

(Example of Cross-Sectional Structure of Memory Cell Array)

Figure 4:
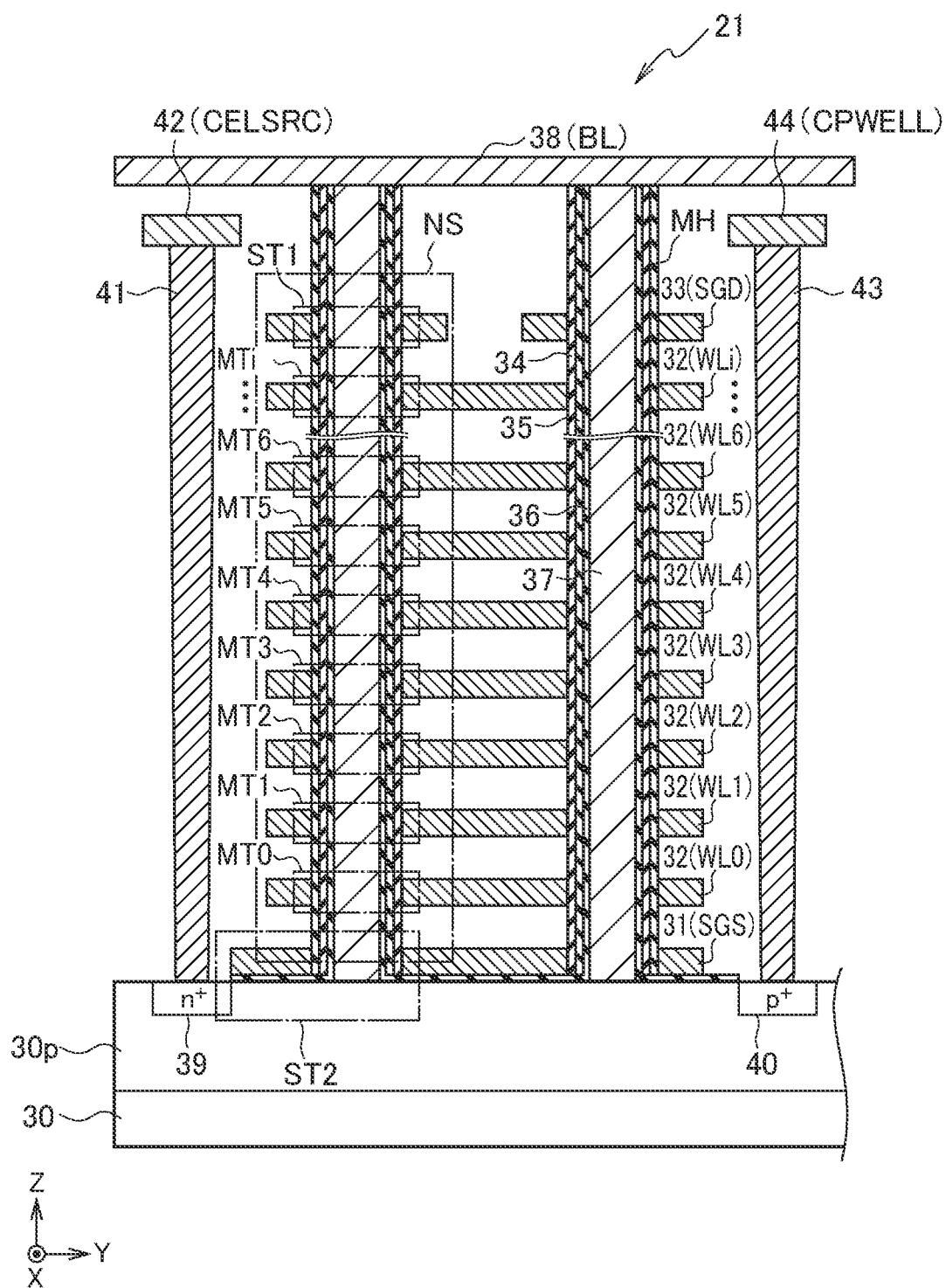
FIG. 4 is a diagram illustrating an example of a cross-sectional structure of the memory cell array according to the embodiments.

FIG. 4 illustrates an example of a cross-sectional structure of the memory cell array 21 in the nonvolatile semiconductor memory device 20 according to the embodiments. FIG. 4 illustrates the portions relating to two string units SU0 and SU1 in one block BLK. Specifically, FIG. 4 illustrates two NAND strings NS of each of the two string units SU0 and SU1, and peripheral portions thereof. A plurality of structures of the NAND string NS illustrated in FIG. 4 are arranged in an X-direction and a Y-direction. For example, a set including a plurality of NAND strings NS aligned in the X-direction corresponds to one string unit SU.

The memory cell array 21 is provided on a semiconductor substrate 30. A plane parallel to a surface of the semiconductor substrate 30 is defined as an XY plane, and a direction perpendicular to the XY plane is defined as a Z-direction. Further, the X-direction and the Y-direction are orthogonal to each other.

A p type well region 30p is disposed above the semiconductor substrate 30. A plurality of NAND strings NS are disposed on the p type well region 30p, as illustrated in FIG. 4. More specifically, on the p type well region 30p, a wiring layer 31 functioning as the select gate line SGS, i+1 wiring layers 32 (WL0 to WLi) functioning as word lines WL0 to WLi, and a wiring layer 33 functioning as the select gate line SGD are sequentially stacked, for example. A plurality of wiring layers 31 and 33 may be stacked thereon. An insulating layer (not illustrated) is disposed between the stacked wiring layers 31 to 33.

The wiring layer 31 is commonly connected to the gates of the respective select transistors ST2 of NAND strings NS in one block BLK, for example. The wiring layer 32 is commonly connected to control gates of the respective memory cell transistors MT of the plurality of NAND strings NS in one block BLK, for each layer.

A memory hole MH is disposed so as to pass through the wiring layers 33, 32, and 31 and to reach the p type well region 30p. On the side surface of the memory hole MH, a block insulating layer 34, a charge storage layer (e.g., insulating layer) 35, and a tunnel oxide layer 36 are sequentially disposed in this order from outside. A semiconductor pillar (e.g., conductive layer) 37 is embedded in the memory hole MH. The semiconductor pillar 37 is non-doped polysilicon, for example, and functions as a current path of the NAND string NS. On a top edge of the semiconductor pillar 37, a wiring layer 38 functioning as a bit line BL is disposed.

As described above, the select transistor ST2, the plurality of memory cell transistors MT, and the select transistor ST1 are sequentially stacked on the upper side of the p type well region 30p, and one memory hole MH corresponds to one NAND string NS.

An $n^+$ type impurity diffusion region 39 and a $p^+$ type impurity diffusion region 40 are disposed on an upper portion of the p type well region 30p. A contact plug 41 is disposed on an upper surface of the $n^+$ type impurity diffusion region 39. On an upper surface of the contact plug 41, a wiring layer 42 functioning as a source line CELSRC is disposed. A contact plug 43 is disposed on an upper surface of the $p^+$ type impurity diffusion region 40. On an upper surface of the contact plug 43, a wiring layer 44 functioning as a well line CPWELL is disposed.

(Block Structural Example of Row Decoder)

Figure 5:
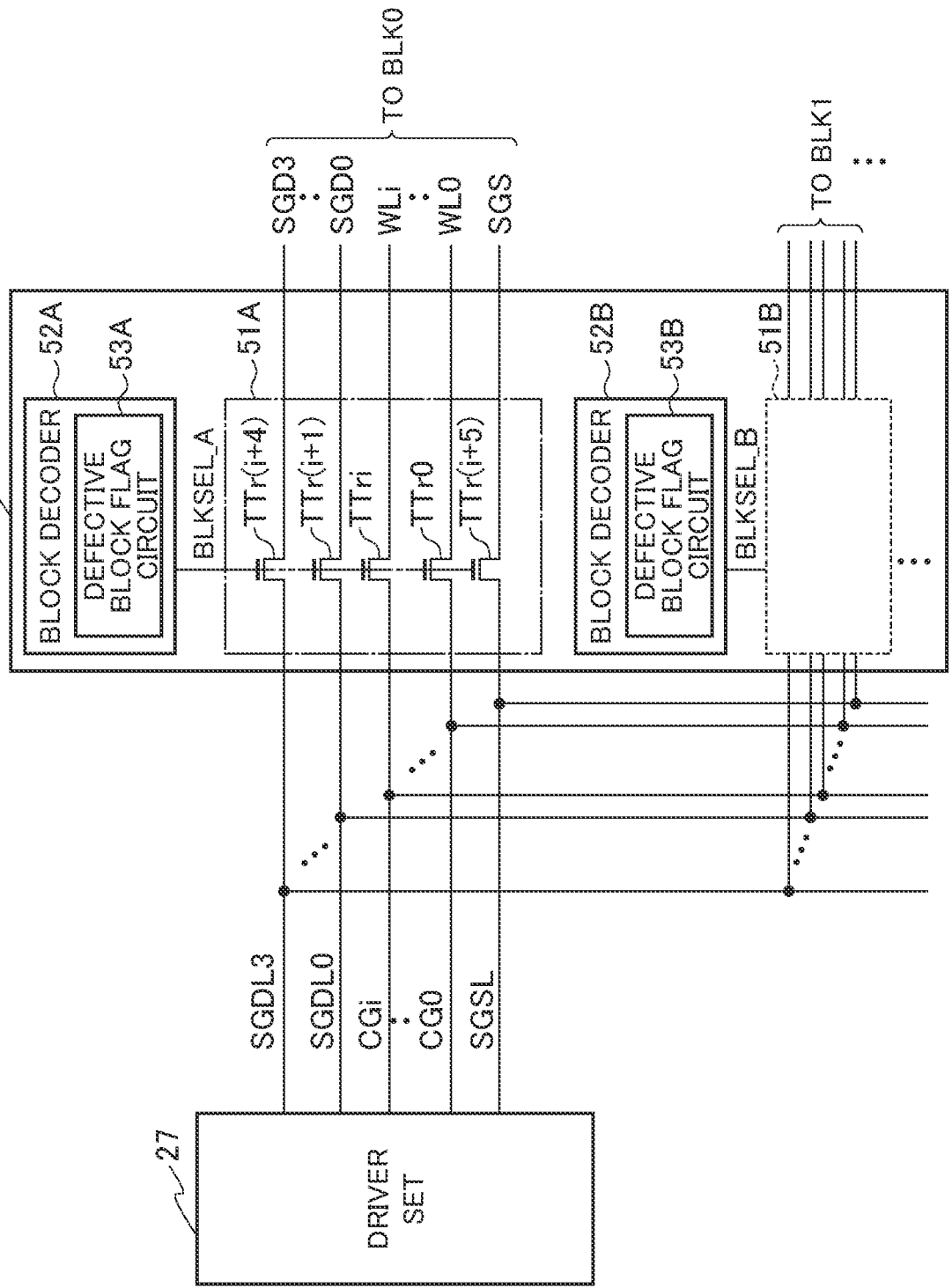
FIG. 5 is a diagram illustrating a block structural example of a row decoder according to the embodiments.

FIG. 5 illustrates one example of a block configuration of the row decoder 28 in the nonvolatile semiconductor memory 20 device according to the embodiments. As illustrated in FIG. 5, the row decoder 28 includes a plurality of transfer switch groups 51 (51A, 51B, . . . ) and a plurality of block decoders 52 (52A, 52B, . . . ).

One transfer switch group 51 and one block decoder 52 are allocated to one block BLK, for example. In the example of FIG. 5, a transfer switch group 51A and a block decoder 52A are allocated to a block BLK0, and a transfer switch group 51B and a block decoder 52B are allocated to a block BLK1. In the following description, a block which is to be written, read, and erased is referred to as a "selected block BLK", and a block except for the selected block BLK is referred to as a "non-selected block BLK."

Moreover, in the following description, when distinguishing between a node corresponding to the transfer switch group 51A and the block decoder 52A, and a node corresponding to the transfer switch group 51B and the block decoder 52B, "_A", "_B", and the like are respectively added to the ends of the reference numerals to distinguish the transfer switch groups and the block decoders. For example, a selected block node BLKSEL connecting between the transfer switch group 51A and the block decoders 52A is referred to as a selected block node BLKSEL_A, and a selected block node BLKSEL connecting between the transfer switch group 51B and the block decoders 52B is referred to as a selected block node BLKSEL_B. It is noted that when particularly not distinguishing between the node corresponding to the transfer switch group 51A and the block decoder 52A, and the node corresponding to the transfer switch group 51B and the block decoder 52B, such "_A", "_B", and the like are not respectively added to the ends of the reference numerals.

The transfer switch group 51 includes (i+6) pieces of the transfer transistors TTr (TTr0 to TTr(i+5)), for example.

The transfer transistor TTr0 to TTri respectively transfer voltages, which are supplied from the driver set 27 to the wirings CG (CG0 to CGi), to the word lines WL0 to WLi of the selected block BLK. The transfer transistors TTr0 to TTri respectively include a first end connected to the word lines WL0 to WLi of the corresponding block BLK, a second end connected to the wirings CG0 to CGi, and a gate commonly connected to the node BLKSEL.

The transfer transistors TTr(i+1) to TTr(i+4) respectively transfer voltages, which are supplied from the driver set 27 to the wirings SGDL (SGDL0 to SGDL3), to the select gate lines SGD0 to SGD3 of the selected block BLK. The transfer transistors TTr(i+1) to TTr(i+4) respectively include a first end connected to the select gate lines SGD0 to SGD3 of the corresponding block BLK, a second end connected to the wirings SGDL0 to SGDL3, and a gate commonly connected to the node BLKSEL.

The transfer transistor TTr(i+5) transfers a voltage, which is supplied from the driver set 27 to the wiring SGSL, to the gate line SGS of the selected block BLK. The transfer transistor TTr(i+5) includes a first end connected to the select block gate line SGS of the corresponding block BLK, a second end connected to the wiring SGSL, and a gate connected to the node BLKSEL.

The block decoder 52 decodes a block address signal received from the register 24 at the time of writing, reading, and erasing of data. The block decoder 52 outputs a signal of High (H) level to the node BLKSEL, when it is determined that a block BLK corresponding to the block decoder 52 is the selected block, as a result of the decoding.

On the other hand, the block decoder 52 outputs a signal of Low (L) level to the node BLKSEL, when it is determined that a block BLK corresponding thereto is not the selected block BLK. The signal which is provide to the node BLKSEL turns an ON state the transfer transistors TTr0 to TTr(i+5) at the "H" level, and turns an OFF state the transfer transistors TTr0 to TTr(i+5) at the "L" level.

The block decoder 52 includes a defective block flag circuit 53 including a plurality of latch circuits configured to store multi-level data. More specifically, the block decoder 52A includes a defective block flag circuit 53A, and the block decoder 52B includes a defective block flag circuit 53B. The multi-level data used herein is information of a defective block flag for each of a plurality of test memory divisions. Moreover, defective block flag information used herein for each of the plurality of test memory divisions is information which indicates whether or not an abnormality in cell tests or the like has occurred in each block. In the following description, the information indicating whether or not an abnormality in cell tests has occurred in each block BLK is also referred to as "defective block flag data" as an example of the multi-level data. In addition, the data of the defective block flag may be pass/fail information of the cell tests, pass/fail determination information of a writing time of an input buffer, and a determination test of fail bit counts, for example.

The block decoder 52 can turn to "L" a signal to be provided to a node BLKSEL on the basis of information stored in a latch circuit in the defective block flag circuit 53, for example, when an abnormality has occurred in the selected block BLK (when the selected block BLK is a defective block).

Accordingly, for example, in the transfer switch group 51 corresponding to the selected block BLK, when the aforementioned selected block BLK is normal (is not a defective block), the transfer transistors TTr0 to TTr(i+5) are turned to the ON state. Accordingly, the word lines WL0 to WLi are respectively connected to the wirings CG0 to CGi. The select gate lines SGD0 to SGD3 are respectively connected to the wiring SGDL0 to SGDL3. The select gate SGS is connected to the wiring SGSL.

On the other hand, in the transfer switch group 51 corresponding to the selected block BLK, when the aforementioned selected block BLK is a defective block, the transfer transistors TTr0 to TTr(i+5) are turned to the OFF state. Consequently, the word line WL is electrically disconnected from the wiring CG, and the select gate lines SGD and SGS are electrically disconnected respectively from the wirings SGDL and SGSL.

Moreover, in the transfer switch group 51 corresponding to the non-selected block BLK, when the non-selected block BLK is a defective block, the transfer transistors TTr0 to TTr(i+5) are turned to the OFF state. Consequently, the word line WL is electrically disconnected from the wiring CG, and the select gate lines SGD and SGS are electrically disconnected respectively from the wirings SGDL and SGSL.

When the non-selected block BLK is not a defective block (i.e., can be used depending on conditions of the data of the defective block flag), the block decoder 52 can turn to "H" a signal provided to the node BLKSEL in the non-selected block BLK, on the basis of the information stored in the latch circuit in a defective block flag circuit 53, by a command issued from the controller 10, for example.

Accordingly, for example, in the transfer switch group 51 corresponding to the non-selected block BLK, when the aforementioned non-selected block BLK is not a defective block (i.e., can be used depending on the conditions of the data of the defective block flag), the transfer transistors TTr0 to TTr(i+5) are turned to the ON state. Accordingly, the word lines WL0 to WLi are respectively connected to the wirings CG0 to CGi. The select gate lines SGD0 to SGD3 are respectively connected to the wiring SGDL0 to SGDL3. The select gate SGS is connected to the wiring SGSL.

The driver set 27 supplies voltages to the wirings CG, SGDL, and SGSL in accordance with the address ADD received from the register 24. The wirings CG, SGDL and SGSL transfer each voltage supplied from the driver set 27 to each of the transfer switch groups 51A, 51B, (Example of Circuit Configuration of Block Decoder)

Figure 6:
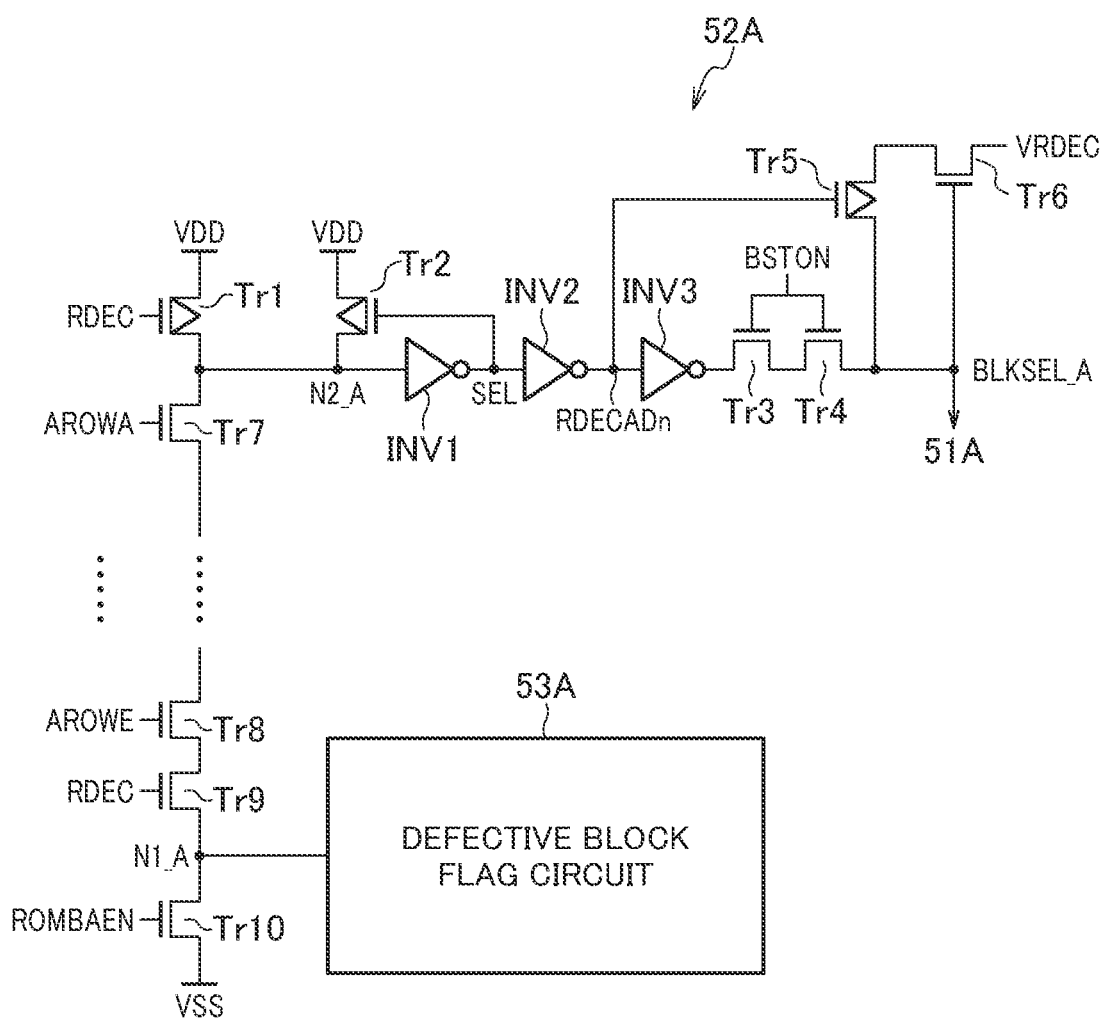
FIG. 6 is a diagram illustrating an example of a circuit configuration of the block decoder according to the embodiments.

FIG. 6 illustrates an example of a circuit configuration of the block decoder 52 in the nonvolatile semiconductor memory device 20 according to the embodiments. FIG. 6 illustrates a configuration of the block decoder 52A corresponding to the block BLK0 as an example of the block decoder 52. As illustrated in FIG. 6, the block decoder 52A includes n channel MOS transistors Tr3, Tr4, Tr6 to Tr10, p channel MOS transistors Tr1, Tr2 and Tr5, inverters INV1 to INV3, and a defective block flag circuit 53A.

The p channel MOS transistor Tr1 includes a first terminal connected to a voltage VDD, a second terminal connected to a node N2_A, and a gate connected to a node RDEC. The voltage VDD is, for example, a power supply voltage and is a voltage capable of turning to ON state each transistor Tr in the block decoder 52A. The node RDEC is a node to which an enable signal of block address decoding is supplied. For example, the node RDEC is set to the "L" level when the block decoder 52A is disabled, and is set to the "H" level when the block decoder 52A is enabled.

The p channel MOS transistor Tr2 includes a first terminal connected to a voltage VDD, a second terminal connected to the node N2_A, and a gate connected to a node SEL. The node SEL is a node to which a signal inverted by the inverter INV1 from a voltage level of the node N2_A is supplied.

The inverter INV1 includes an input terminal connected to the node N2_A, and an output terminal connected to the node SEL. That is, the inverter INV1 inverts a voltage level at the node N2_A and provides this signal to the node SEL. In other words, the node N2_A and the node SEL have logical level signals that are inverted from each other.

The inverter INV2 includes an input terminal connected to the node SEL, and an output terminal connected to a node RDECADn. That is, inverter INV2 inverts a voltage level in the node SEL and provides this signal to the node RDECADn. In other words, the node SEL and the node RDECADn have logical level signals that are inverted from each other. The node RDECADn is a node to which a signal inverted by the inverter INV2 from a voltage level of the node SEL is supplied.

The inverter INV3 includes an input terminal connected to the node RDECADn, and an output terminal connected to a first terminal of the n channel MOS transistor Tr3. That is, the inverter INV3 inverts a voltage level at the node RDECADn, and provides this signal to the first terminal of the n channel MOS transistor Tr3. In other words, the node RDECADn and the first terminal of the n channel MOS transistor Tr3 have logical level signals inverted from each other.

The n channel MOS transistors Tr3 and Tr4 are connected in series to each other between the output terminal of the inverter INV3 and a node BLKSEL_A. More specifically, a first terminal of the n channel MOS transistor Tr3 is connected to the output terminal of the inverter INV3, and a second terminal of the n channel MOS transistor Tr4 is connected to the node BLKSEL_A. A signal BSTON is supplied to gates of the n channel MOS transistors Tr3 and Tr4, respectively.

The p channel MOS transistor Tr5 includes a first terminal connected to a second terminal of the n channel MOS transistor Tr6, a second terminal connected to the node BLKSEL_A, and a gate connected to the node RDECADn. The node BLKSEL_A can be turned to the "H" level, for example, when the block BLK0 is a selected block BLK. Moreover, the node BLKSEL_A can be turned to the "L" level when the block BLK0 is a non-selected block BLK.

The n channel MOS transistor Tr6 includes a first terminal connected to the node VRDEC, a second terminal connected to the first terminal of the p channel MOS transistor Tr5, and a gate connected to the node BLKSEL_A. The node VRDEC is a node for supplying a high voltage.

The n channel MOS transistors Tr7 and Tr8 are connected in series to each other between the node N2_A and the first terminal of the n channel MOS transistor Tr9. More specifically, a first terminal of the n channel MOS transistor Tr7 is connected to the node N2_A, and a second terminal of the n channel MOS transistor Tr8 is connected to a first terminal of the n channel MOS transistor Tr9. Signals AROWA and AROWE are respectively supplied to gates of the n channel MOS transistors Tr7 and Tr8. The signals AROWA and AROWE are signals generated on the basis of the block address signal, and when the block BLK0 is a selected block, each of the n channel MOS transistors Tr7 and Tr8 is turned the ON state.

The n channel MOS transistor Tr9 includes a first terminal connected to the second terminal of the n channel MOS transistor Tr8, a second terminal connected to a node N1_A, and a gate connected to a signal terminal RDEC. The node N1_A is a node configured to supply a voltage level to the defective block flag circuit 53A described below.

The n channel MOS transistor Tr10 includes a first terminal connected to the node N1_A, a second terminal connected to a voltage VSS, and a gate connected to a signal terminal ROMBAEN.

An input address decoding unit is formed of these p channel MOS transistor Tr1 and the n channel MOS transistors Tr7 to Tr10, and when the signals AROWA and AROWE, the signal RDEC, and the signal ROMBAEN are all turned to the "H" level, the node N2_A is grounded and is turned to the "L" level. In the following description, a configuration including the p channel MOS transistor Tr1 and the n channel MOS transistors Tr7 to Tr10 is referred to as an input address decoding unit.

On the other hand, if the node N2_A is not grounded, the node N2_A maintains the "H" level. In this way, the input address decoding unit provides the voltage level of the node N2_A to the inverter INV1.

In the following description in the row decoder 28 of the nonvolatile semiconductor memory device 20 according to first to third embodiments, for example, the same symbol is applied to the common part of the block decoder 52A and the detailed description thereof is omitted, and the different part thereof is described.

First Embodiment

Figure 7:
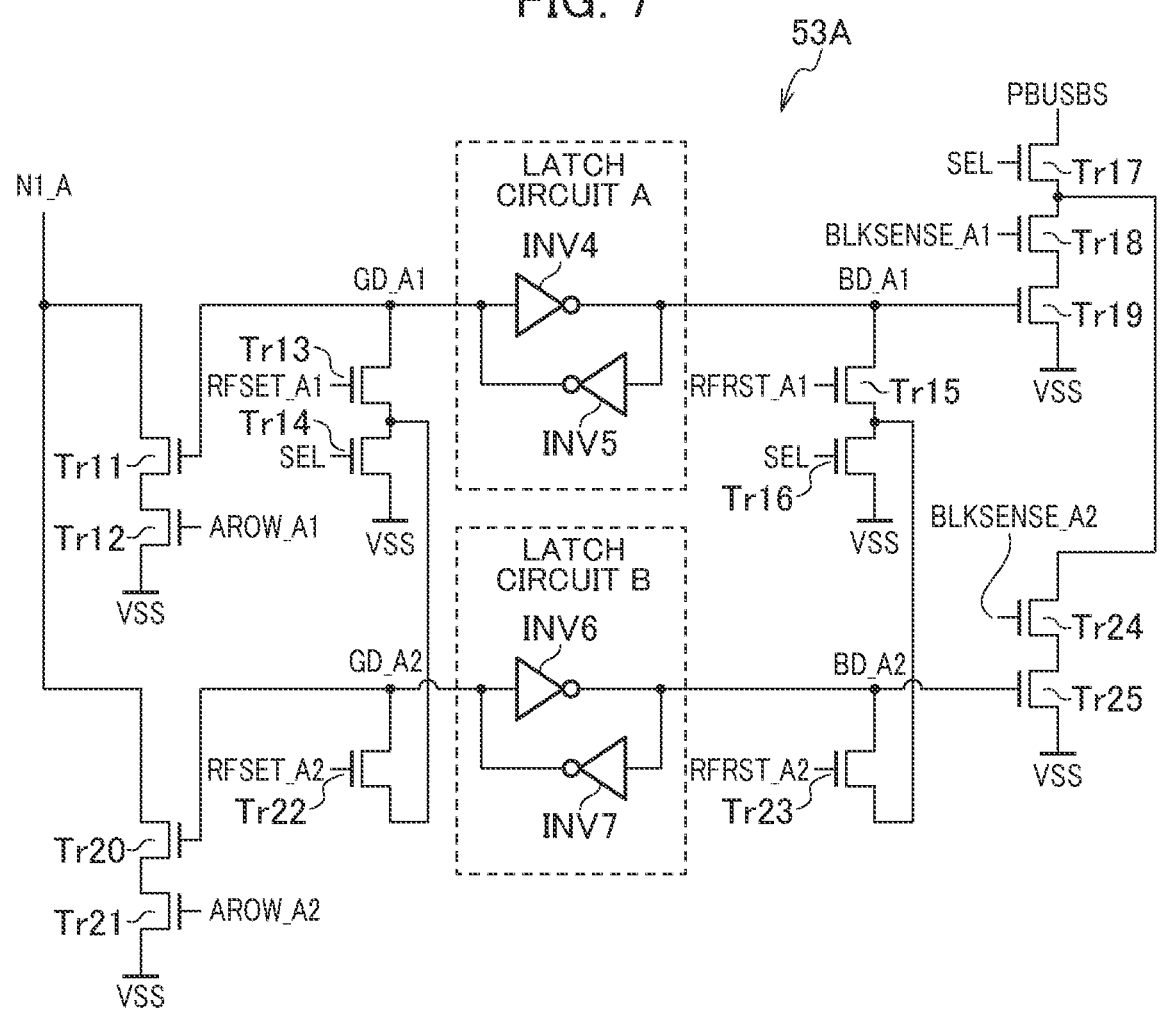
FIG. 7 is a diagram illustrating an example of a circuit configuration of a defective block flag circuit according to a first embodiment.

FIG. 7 illustrates an example of a circuit configuration of a defective block flag circuit 53 in the nonvolatile semiconductor memory device 20 according to the first embodiment. FIG. 7 illustrates a configuration of the defective block flag circuit 53A corresponding to a block BLK0 as an example of the defective block flag circuit 53. The defective block flag circuit 53 in the nonvolatile semiconductor memory device 20 according to the first embodiment has 2-bit defective block flag data which is an example of the multi-level data.

Example of Circuit Configuration of Defective Block Flag Circuit According to First Embodiment The defective block flag circuit 53A is composed of n channel MOS transistors Tr1/ to Tr25 and inverters INV4 to INV7, as illustrated in FIG. 7.

The n channel MOS transistors Tr11 and Tr12 are connected in series to each other between a node N1_A and a voltage VSS. More specifically, a first terminal of the n channel MOS transistor Tr1/ is connected to the node N1_A, and a second terminal of the n channel MOS transistor Tr12 is connected to the voltage VSS. The node GD_A1 is supplied to a gate of the n channel MOS transistor Tr11. A signal AROW_A1 is supplied to a gate of the n channel MOS transistor Tr12. That is, when the node GD_A1 and the signal AROW_A1 are at the "H" level, the node N1_A is turned to the "L" level. In the following description, when the node GD_A1 and the signal AROW_A1 are at the "H" level, the n channel MOS transistors Tr11 and Tr12 that transfer the "L" level to the node N1_A are referred to as a "first transistor group."

The inverters INV4 and INV5 are cross-connected to each other to compose a first latch circuit. More specifically, the inverter INV4 includes an input terminal connected to the node GD_A1 and an output terminal connected to a node BD_A1. Moreover, the inverter INV5 includes an input terminal connected to the node BD_A1, and an output terminal connected to the node GD_A1. That is, the node GD_A1 and the node BD_A1 have logical levels inverted from each other. Specifically, the node GD_A1 and the node BD_A1 have 1-bit defective block flag data. For example, the 1-bit defective block flag data indicates that the block BLK0 is not a defective block when the node GD_A1 and the node BD_A1 are respectively at the "H" level and the "L" level, and indicates that the block BLK0 is a defective block when the node GD_A1 and the node BD_A1 are respectively at "L" level and the "H" level. In the following description, an example of the first latch circuit where the inverters INV4 and INV5 are cross-connected to each other is also referred to as a "latch circuit A."

The n channel MOS transistors Tr13 and Tr14 are connected in series to each other between the node GD_A1 and the voltage VSS. More specifically, a first terminal of the n channel MOS transistor Tr13 is connected to the node GD_A1, and a second terminal of the n channel MOS transistor Tr14 is connected to the voltage VSS. A node RFSET_A1 is supplied to a gate of the n channel MOS transistor Tr13. Moreover, the node SET is supplied to the n channel MOS transistor Tr14.

The node RFSET_A1 is a node where a signal for setting information indicating that the block BLK0 is a defective block to the latch circuit A is transferred. More specifically, when the node RFSET_A1 is at the "H" level, the "L" level is transferred to the node GD_A1 and the information indicating that the block BLK0 is a defective block is set to the latch circuit A in the defective block flag circuit 53A. In the following description, the n channel MOS transistors Tr13 and Tr14 configured to set the information indicating that it is a defective block to the latch circuit A are also referred to as a "first data set unit."

The n channel MOS transistors Tr15 and Tr16 are connected in series to each other between the node BD_A1 and the voltage VSS. More specifically, a first terminal of the n channel MOS transistor Tr15 is connected to the node BD_A1 and a second terminal of the n channel MOS transistor Tr16 is connected to the voltage VSS. A node RFRST_A1 is supplied to a gate of the n channel MOS transistor Tr15. Moreover, the node SEL is supplied to the n channel MOS transistor Tr16.

The node RFRST_A1 is a node where a signal for resetting information indicating that the block BLK0 is a defective block from the latch circuit A is transferred. More specifically, when the node RFRST_A1 is at the "H" level, the "L" level is transferred to the node BD_A1 and the information indicating that the block BLK0 is not a defective block is reset to the latch circuit A in the defective block flag circuit 53A. In the following description, the n channel MOS transistors Tr15 and Tr16 configured to reset the information indicating that it is a defective block from the latch circuit A are referred to as a "first data reset unit."

The n channel MOS transistors Tr17 to Tr19 are connected in series to one another between a node PBUSBS and a voltage VSS. More specifically, a first terminal of the n channel MOS transistor Tr17 is connected to the node PBUSBS, and a second terminal of the n channel MOS transistor Tr19 is connected to the voltage VSS.

A node SEL is supplied to a gate of the n channel MOS transistor Tr17. Moreover, the node BLKSENSE_A1 is supplied to the n channel MOS transistor Tr18. Furthermore, the node BD_A1 is supplied to the n channel MOS transistor Tr19. The node BLKSENSE_A1 is a node used for determination of whether or not to target the information of the latch circuit A.

A node PBUSBS is a node to which a signal for sensing information stored in all the defective block flag circuits 53 including the defective block flag circuit 53A, for example, is transferred (i.e., a sense node of the defective block flag circuit 53). For example, when a block BLK corresponding to the defective block flag circuit 53 to be sensed is a defective block, the node PBUSBS is in a floating state at the "H" level, and is turned to the "L" level when the block BLK is not a defective block. In the following description, the n channel MOS transistors Tr17 to Tr19 used for sensing the information of the latch circuit A are referred to as a "second transistor group."

The n channel MOS transistors Tr20 and Tr21 are connected in series to each other between the node N1_A, and the voltage VSS. More specifically, a first terminal of n channel MOS transistor Tr20 is connected to the node N1_A, and a second terminal of the n channel MOS transistor Tr21 is connected to the voltage VSS. The node GD_A2 is supplied to a gate of the n channel MOS transistor Tr20. Moreover, a signal AROW_A2 is supplied to a gate of the n channel MOS transistor Tr21. That is, when the node GD_A2 and the signal AROW_A2 are at the "H" level, the node N1_A is turned to the "L" level. In the following description, when the node GD_A2 and the signal AROW_A2 are at the "H" level, the n channel MOS transistors Tr20 and Tr21 that transfer the "L" level to the node N1_A are referred to as a "third transistor group."

The inverters INV6 and INV7 are cross-connected to each other to compose a second latch circuit. More specifically, the inverter INV6 includes an input terminal connected to the node GD_A2 and an output terminal connected to a node BD_A2. Moreover, the inverter INV6 includes an input terminal connected to the node BD_A2, and an output terminal connected to the node GD_A2. That is, the node GD_A2 and the node BD_A2 have logical levels inverted from each other. Specifically, the node GD_A2 and the node BD_A2 have 1-bit defective block flag data. For example, the 1-bit defective block flag data indicates that the block BLK0 is not a defective block when the node GD_A2 and the node BD_A2 are respectively at the "H" level and the "L" level, and indicates that the block BLK0 is a defective block when the node GD_A2 and the node BD_A2 are respectively at "L" level and the "H" level. In the following description, an example of the second latch circuit where the inverters INV6 and INV7 are cross-connected to each other is also referred to as a "latch circuit B."

The n channel MOS transistor Tr22 includes a first terminal connected to the node GD_A2, a second terminal connected to the first terminal of the n channel MOS transistor Tr14, and the gate connected to a signal RFSET_A2.

The node RFSET_A2 is a node where a signal for setting information indicating that the block BLK0 is a defective block to the latch circuit B is transferred. More specifically, when the node RFSET_A2 is at the "H" level, the "L" level is transferred to the node GD_A2 and the information indicating that the block BLK0 is a defective block is set to the latch circuit B in the defective block flag circuit 53A. In the following description, the n channel MOS transistor Tr22 configured to set the information indicating that it is a defective block to the latch circuit B are referred to as a "second data set unit."

The n channel MOS transistor Tr23 includes a first terminal connected to the node BD_A2, a second terminal connected to the first terminal of the n channel MOS transistor Tr16, and the gate connected to a signal RFRST_A2.

The node RFRST_A2 is a node where a signal for resetting information indicating that the block BLK0 is a defective block from the latch circuit B is transferred. More specifically, when the node RFSET_A2 is at the "H" level, the "L" level is transferred to the node GD_A2 and the information indicating that the block BLK0 is not a defective block is reset to the latch circuit B in the defective block flag circuit 53A. In the following description, the n channel MOS transistor Tr23 configured to reset the information indicating that it is a defective block from the latch circuit B are referred to as a "second data reset unit."

The n channel MOS transistors Tr24 and Tr25 are connected in series to each other between the second terminal of the n channel MOS transistor Tr17 and the voltage VSS. More specifically, a first terminal of the n channel MOS transistor Tr24 is connected to the second terminal of the n channel MOS transistor Tr17, and a second terminal of the n channel MOS transistor Tr25 is connected to the voltage VSS.

A node BLKSENSE_A2 is supplied to a gate of the n channel MOS transistor Tr24. Furthermore, the node BD_A2 is supplied to the n channel MOS transistor Tr25. The node BLKSENSE_A2 is a node used for determination of whether or not to target the information of the latch circuit B. In the following description, the n channel MOS transistors Tr24 and Tr25 used for sensing the information of the latch circuit B are referred to as a "fourth transistor group."

As described above, in accordance with the first embodiment, the defective block flag circuit 53 can includes the latch circuit A and the latch circuit B which are respectively examples of the first latch circuit and the second latch circuit, and can have the 2-bit defective block flag data which is an example of the multi-level data. Namely, the defective block flag circuit 53 can select the defective block flag data by registering the information of the two test divisions, which is the defective block flag data, and can use the non-selected block BLK registered as the defective block by switching the state of the non-selected block BLK to the selected block BLK. In addition, an operation in which the defective block flag circuit 53 switches the state from the non-selected block BLK registered as the defective block to the selected block BLK will be described later.

(Operation Example of Cell Test)

Next, an example of an operation of a cell test of the defective block flag circuit 53 according to the first embodiment will now be described. Specifically, the defective block flag circuit 53 sets defective block flag data of two cell test results, in 2-bit defective block flag data. The first is one bit latched in the latch circuit A, which is a 2-bit cell test result which is, for example, MLC. The second is one bit latched in the latch circuit B, which is a 1-bit cell test result, which is, for example, SLC. In the following description, the 2-bit cell test which is the MLC mode is referred to as an MLC cell test. Moreover, the 1-bit cell test which is the SLC mode is referred to as a SLC cell test.

Figure 8A:
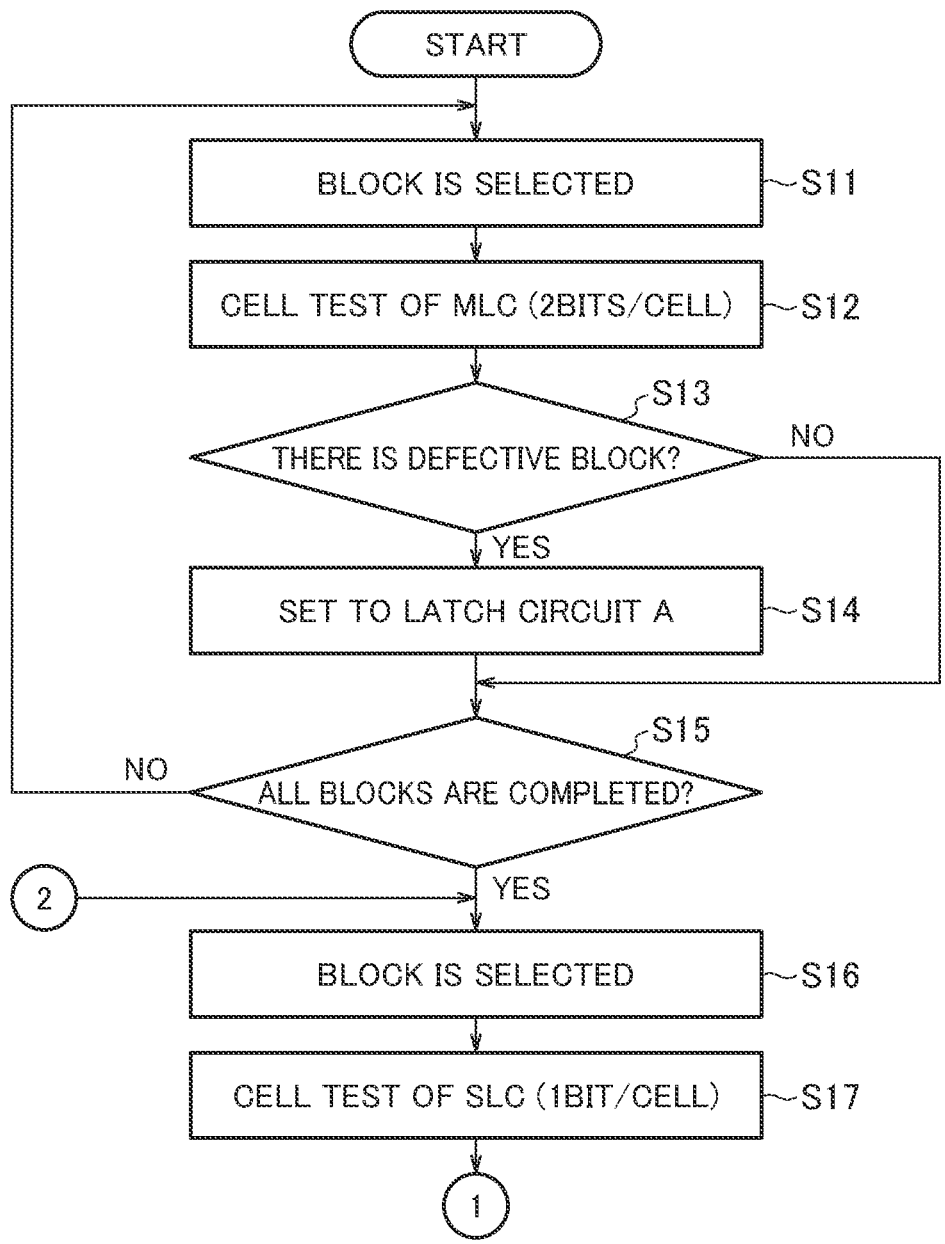
FIG. 8A is a flow chart illustrating an operation example of a cell test of an MLC (2 bits/cell) and an SLC (1 bit/cell) according to the first embodiment. (Phase 1)
Figure 8B:
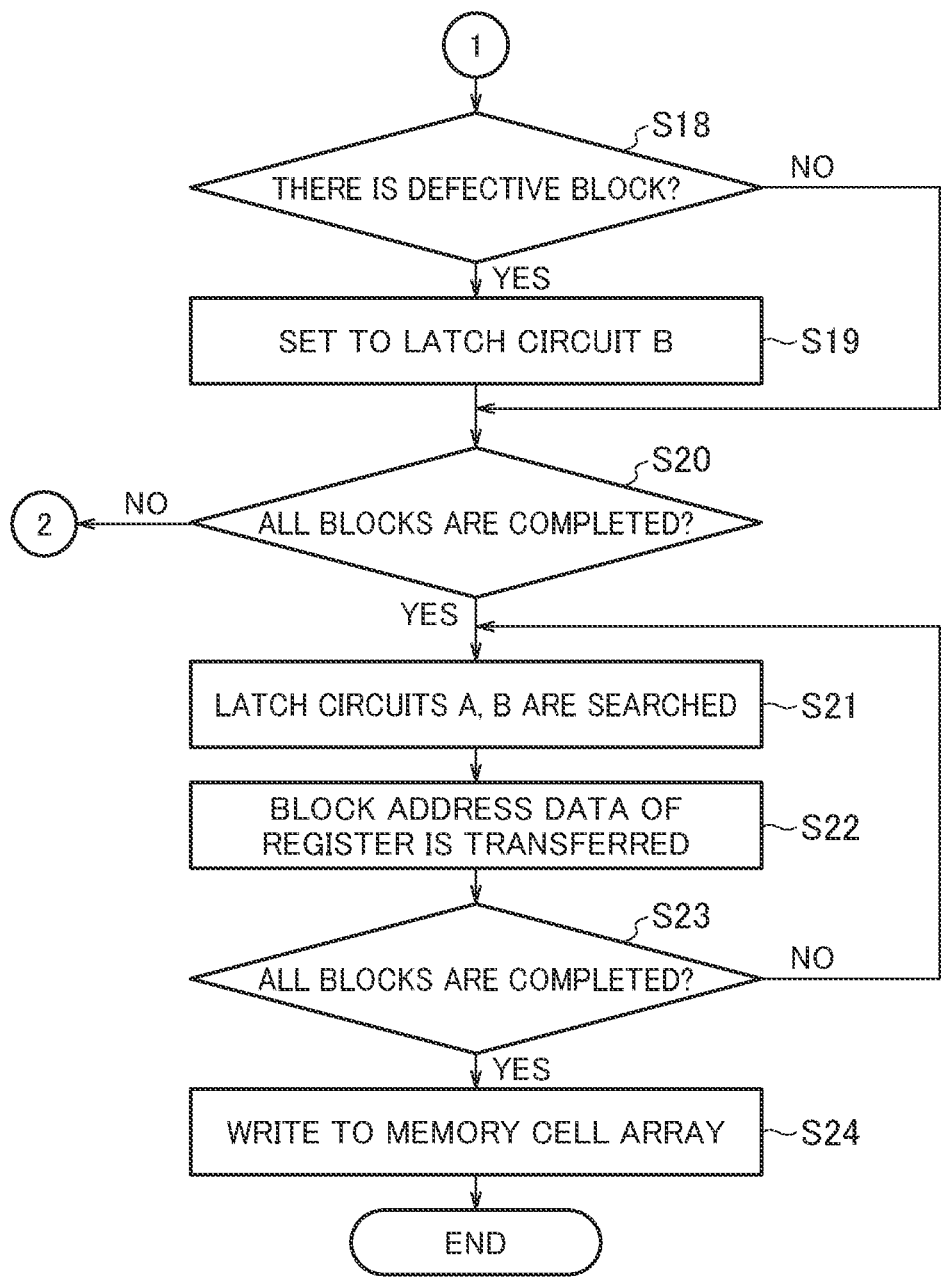
FIG. 8B is a flow chart illustrating an operation example of the cell test of the MLC and the SLC according to the first embodiment. (Phase 2)

An example of an operation of a cell test of the nonvolatile semiconductor memory device 20 according to the first embodiment is represented as illustrated in FIGS. 8A and 8B. During a cell test with respect to the nonvolatile semiconductor memory device 20, various tests are performed by a tester and thereby a defective block is detected from the memory cell array 21. An address of the detected defective block is written to the memory cell array 21.

As mentioned above, the respective latch circuits in the defective block flag circuit 53 register the respective defective block flags of the cell tests in the respective one bit data. That is, since the block decoder 52 according to the first embodiment has 2-bit defective block flag data, which is written to the memory cell array 21 with four values. Alternatively, the 1-bit defective block flag data of each cell test may also be written to the memory cell array 21 with two values. However, it is not actually limited to these examples.

In Step S11, the row decoder 28 receives a row address in the address ADD from the register 24 and selects a target block BLK on the basis of a block address in the received row address. More specifically, the row decoder 28, for example, turns the signal to be provided to the node BLKSEL_A to "H" by the block decoder 52A, and sets the target block BLK0 as a selected block BLK.

In Step S12, the row decoder 28 executes an MLC cell test with respect to the target block BLK. More specifically, the row decoder 28 execute the MLC cell test with respect to the block BLK0, which is made the selected block BLK by the block decoder 52A, for example.

In Step S13, if the target block BLK is a defective block, the process executed by the row decoder 28 advances to Step S14. If the target block BLK is not a defective block, the process executed by the row decoder 28 advances to Step S15.

In Step S14, the row decoder 28 sets information of the target block BLK to the latch circuit A, which is an example of the first latch circuit. More specifically, the row decoder 28 turns the node RFSET_A1 to the "H" level by the defective block flag circuit 53A in the block decoder 52A of the target block BLK0, for example. The "L" level is transferred to the node GD_A1 by turning the node RFSET_A1 to the "H" level in the defective block flag circuit 53A, and thereby information indicating that the block BLK0 is a defective block is set to the latch circuit A.

In Step S15, if all the blocks BLK have already been selected, the process executed by the row decoder 28 advances to Step S16. On the other hand, if all the blocks BLK have already been selected, the process executed by the row decoder 28 returns to Step S11.

In Step S16, the row decoder 28 receives a row address in the address ADD from the register 24 and selects a target block BLK on the basis of a block address in the received row address. Specifically, the row decoder 28, for example, turns the signal to be provided to the node BLKSEL_A to "H" by the block decoder 52A, and sets the target block BLK0 as a selected block BLK.

In Step S17, the row decoder 28 executes an SLC cell test with respect to the target block BLK. More specifically, the row decoder 28 execute the SLC cell test with respect to the block BLK0, which is made the selected block BLK by the block decoder 52A, for example.

In Step S18, if the target block BLK is a defective block, the process executed by the row decoder 28 advances to Step S19. If the target block BLK is not a defective block, the process executed by the row decoder 28 advances to Step S20.

In Step S19, the row decoder 28 sets information of the target block BLK to the latch circuit B, which is an example of the second latch circuit. More specifically, the row decoder 28 turns the node RFSET_A2 to the "H" level by the defective block flag circuit 53A in the block decoder 52A of the target block BLK0, for example. The "L" level is transferred to the node GD_A2 by turning the node RFSET_A2 to the "H" level in the defective block flag circuit 53A, and thereby information indicating that the block BLK0 is a defective block is set to the latch circuit B.

In Step S20, if all the blocks BLK have already been selected, the process executed by the row decoder 28 advances to Step S21. On the other hand, if all the blocks BLK have already been selected, the process executed by the row decoder 28 returns to Step S16.

In Step S21, the row decoder 28 searches the latch circuit A and the latch circuit B. Specifically, the row decoder 28 detects whether or not defective block flag data is set in the latch circuit A and the latch circuit B in order starting from the block BLK0.

In Step S22, the row decoder 28 transfers the block address in the register 24 to the sense amplifier module 29 if the defective block flag data is set in the latch circuit A and /or the latch circuit B.

In Step S23, if all the blocks BLK have already been selected, the process executed by the row decoder 28 advances to Step S24. On the other hand, if all the blocks BLK have already been selected, the process executed by the row decoder 28 returns to Step S21.

In Step S24, the row decoder 28 transfers the defective block flag data in all the latch circuit A and the latch circuit B and the block address data in the register 24 to the sense amplifier module 29, to be then written to the memory cell array 21.

As described above, in accordance with the first embodiment, the row decoder 28 can write the data of the plurality of defective block flags set respectively by the different cell tests into the memory cell array 21, in the cell tests of the nonvolatile semiconductor memory device 20. Specifically, in the cell test, the row decoder 28 writes the defective block flag data, which includes one bit that indicates the cell test result of, for example, MLC, latched in one latch circuit A, and one bit that indicates the cell test result of, for example, SLC, latched in the other latch circuit B, into the memory cell array 21 with quaternary data.

FIG. 9 is a schematic diagram illustrating and a relationship between a cell distribution and a threshold where quaternary data (2 bit/cell) is written to the memory cell array 21. That is, such quaternary data can be written to the memory cell array 21 by being written to the block BLK at different threshold voltages. Specifically, FIG. 9 illustrates, for example, that with respect to the cell distribution, Data "11" is the threshold voltage level Level-0, Data "10" is the threshold voltage level Level-1, Data "01" is the threshold voltage level Level-2, and Data "00" is the threshold voltage level Level-3.

FIG. 10 illustrates an address map of the defective block flag data. This address map is an example of the defective block flag data written to the memory cell array 21 during the operation (S11 to S24) of the above-mentioned cell tests, for example.

As illustrated in FIG. 10, a region A of the defective block flag data is one bit latched in the latch circuit A and indicates a result of the MLC cell test, for example. Moreover, a region B of the defective block flag data is one bit latched in the latch circuit B and indicates a result of the SLC cell test, for example. That is, in accordance with a result of each of the MLC cell test and the SLC cell test, "1" is set to a block corresponding to a block address (block BLK0, block BLK1, . . . ) which is a defective block.

In FIG. 10, "0" indicates that the block corresponding to the block address is normal. Moreover, "1" indicates that the block corresponding to the block address is failure. That is, for example, the block BLK0 is normal in each of the MLC cell test and the SLC cell test. The block BLK1 is failure in the MLC cell test and is normal in the SLC cell test. The block BLK2 is normal in the MLC cell test and is failure in the SLC cell test. The block BLK3 is failure in the MLC cell test and is also failure in the SLC cell test.

FIG. 11 is a diagram illustrating an example of a relationship between defective block flag data and a determination thereof. In accordance with the first embodiment, as illustrated in FIG. 11, the nonvolatile semiconductor memory device 20 can use a non-selected block BLK as a selected block BLK, on the basis of a result of an MLC cell test indicated by one bit, which is the region A of the defective block flag and a result of the SLC cell test indicated by the other bit, which is the region B of the defective block flag. That is, in FIG. 11, the block BLK in which the result of the MLC cell test is failure but the result of the SLC cell test is normal cannot be used as the MLC but can be used as the SLC (i.e., is "available as B"). In the following description, a block which is normal in both of the MLC cell test and the SLC cell test is referred to as a completely normal block. Moreover, a block which is failure in both of the MLC cell test and the SLC cell test is referred to as a completely failure block. However, it is not actually limited to these examples.

(Operation Example of Power on Reset)

Next, an example of a power on reset operation of the defective block flag circuit 53 according to the first embodiment will now be described.

Figure 12:
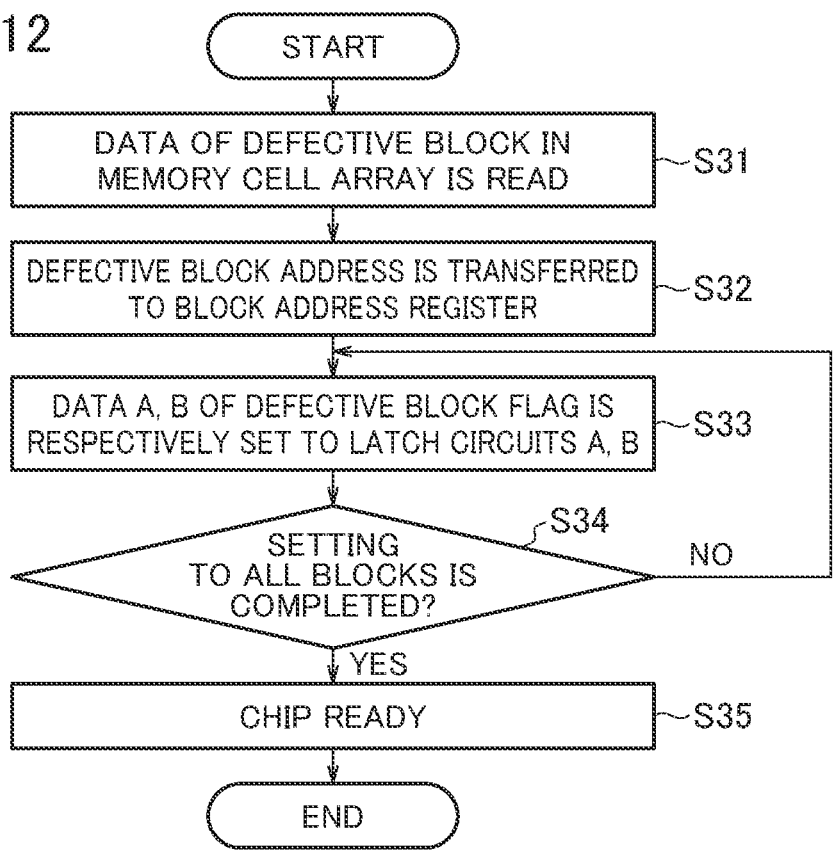
FIG. 12 is a flow chart illustrating an operation example of a power on reset process according to the first embodiment.

FIG. 12 illustrates an example of a power on reset operation of the nonvolatile semiconductor memory device 20 according to the first embodiment. As a matter of convenience of explanation, an operating method for, for example, setting a flag in the power on reset process will now be described.

In the nonvolatile semiconductor memory device 20, when it is detected that a power source is turned on, the sequencer 25 executes a power on reset process as an initialization operation.

In this power on reset process, the defective block address stored in the memory cell array 21 is read and is set to one of or each of the latch circuit A and the latch circuit B.

In Step S31, the sequencer 25 reads defective block data from the memory cell array 21 by means of the sense amplifier module 29. More specifically, the defective block address, column replacement information, and trimming information are read from the memory cell array 21 and then are transferred to the sense amplifier module 29. The data with regard to the defective block to be read from the memory cell array 21 may be data other than the defective block address, the column replacement information, and the trimming information, and are not limited thereto.

In Step S32, the sequencer 25 senses the data of the defective block address read by the sense amplifier module 29, and transfers the sensed and read defective block data to the register 24.

In Step S33, the row decoder 28 receives a row address in the address ADD from the register 24 and sets the defective block flag data to the latch circuit A and the latch circuit B on the basis of the block address in the received row address. Specifically, the row decoder 28 sets defective block flag data in the latch circuit A and the latch circuit B in order starting from the block BLK0. Furthermore, the row decoder 28 sets a block in which data of both of the latch circuit A and the latch circuit B are "0", i.e., block in which the data in both of the result of the MLC cell test and the result of the SLC cell test are completely normal, as a selected block BLK, and sets the other blocks as a non-selected block BLK.

In Step S34, if all the blocks BLK have already been selected, the process executed by the row decoder 28 advances to Step S35. On the other hand, if all the blocks BLK have already been selected, the process executed by the row decoder 28 returns to Step S33.

In Step S35, when the sequencer 25 selects all the blocks BLK, the nonvolatile semiconductor memory device 20 becomes accessible chip ready state and can accept commands from the controller 10.

As described above, in accordance with the first embodiment, the row decoder 28 completes the setting of the plurality of defective block flag data to the latch circuit A and the latch circuit B in the power on reset process of the nonvolatile semiconductor memory device 20.

The low decoder 28 completes the setting of the data of the plurality of defective block flags in the latch circuit A and the latch circuit B, so that a block BLK corresponding to the defective block addresses determined to be defective in the different cell tests are made into the non-selected block BLK. That is, a row decoder 28 switches a block determined to be a defective block to the non-selected block and switches a block determined not to be a defective block to the selected block, on the basis of the multi-level data. That is, each of the blocks BLK will become the non-selected block BLK if the defective block flag thereof indicates that it is failure.

(Operation Example of SLC Buffer)

Next, an example of an operation of the SLC buffer, which is an example of a first command of the defective block flag circuit 53 according to the first embodiment will now be described. The block BLK can be used exclusively as the SLC even if a result of one of the different cell tests, the MLC cell test, is failure but a result of the other SLC cell test is normal, as illustrated in FIG. 11. Namely, after the power on reset process, a non-selected block BLK can be switched to a selected block, on the basis of a result of the MLC cell test indicated by one bit, which is A of the defective block flag and a result of the SLC cell test indicated by the other bit, which is B of the defective block flag, when using the SLC buffer, which is, for example, the first command, by a command from the controller 10. In addition, the operating method for switching the non-selected block BLK to the selected block may be executed in response to not only the command from the controller 10 but also by the sequencer 25 which reads a specific command register from the register 24, for example. However, it is not actually limited to these examples.

Figure 13:
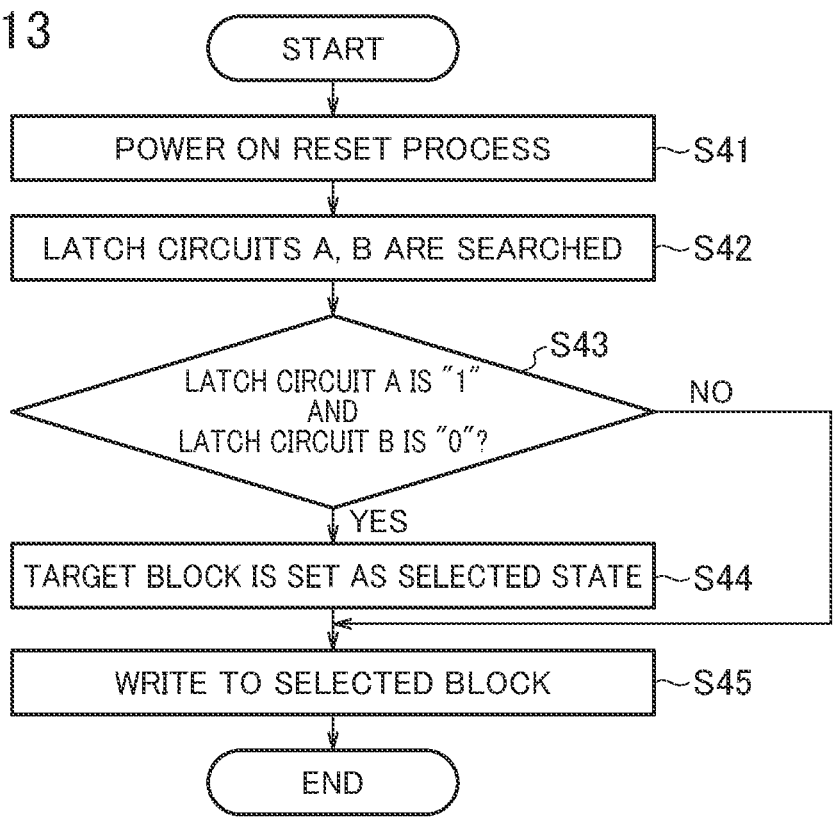
FIG. 13 is a flow chart illustrating an operation example of an SLC buffer according to the first embodiment.

FIG. 13 illustrates an example of an operation of the SLC buffer in the nonvolatile semiconductor memory device 20 according to the first embodiment. For example, the following describes an operation of the SLC buffer at the time when a power is turned on and the SLC buffer is used by a command from the controller 10 after the power on reset process.

In Step S41, the sequencer 25 executes a power on reset process when the power is turned on.

In Step S42, the row decoder 28 searches the latch circuit A and the latch circuit B. Specifically, the row decoder 28 detects whether or not defective block flag data is set in the latch circuit A and the latch circuit B in order starting from the block BLK0, by means of the block decoder 52.

In Step S43, the row decoder 28 extracts a defective block in which the defective block flag of the latch circuit A is "1" and the defective block flag of the latch circuit B is "0" from the defective block address, and the process advances to Step S44 if it is a target defective block of this condition. The row decoder 28 extracts a defective block in which the defective block flag of the latch circuit A is "1" and the defective block flag of the latch circuit B is "0" from the defective block address, and the process advances to Step S45 if it is not a target defective block of this condition.

In Step S44, the row decoder 28 switches the target defective block from the non-selected block to the selected block. More specifically, the row decoder 28 provides the "H" level signal to the node BLKSEL when the block decoder determines that the target block BLK is the selected block on the basis of the condition that the defective block flag of the latch circuit A is "1" and the defective block flag of the latch circuit B is "0."

In Step S45, the row decoder 28 decodes, by means of the block decoder 52, a block address signal received from the register 24 at the time of write, read, and erase operations, and executes write, read, and erase operations with respect to the selected block. That is, the row decoder 28 executes the write operation to the memory cell array 21.

As described above, in accordance with the first embodiment, the row decoder 28 is configured to switch the target defective block from the non-selected block to the selected block in response to the command from the register, on the basis of the multi-level data. More specifically, for example, in the process using the SLC buffer which is an example of the first command of the nonvolatile semiconductor memory device 20, the low decoder 28, on the basis of the data of the plurality of defective block flags in the latch circuit A and the latch circuit B, switches the block BLK corresponding to the defective block addresses determined to be defective in the different from the non-selected block BLK to the selected block BLK. That is, the non-selected block BLK is switched to the selected block from the non-selected block BLK on the basis of the plurality of defective block flag data.

(Effects Produced from First Embodiment)

In accordance with the first embodiment, the row decoder 28 includes the latch circuit A and the latch circuit B, which are respectively examples of the first latch circuit and the second latch circuit, in the block decoder for switching between the selected block BLK and the non-selected block BLK, and thereby can have 2-bit defective block flag data which is the example of the multi-level data. That is, the defective block flag circuit 53 registers the information of the two test divisions, which is the defective block flag data, and thereby can select the defective block flag data and use the non-selected block BLK registered as a defective block by being switched to the selected block BLK.

In accordance with the first embodiment, the row decoder 28 can classify the defective block, and can use a part of the defective blocks as a selected block in response to the first command from the controller 10, for example. Accordingly, a yield of the nonvolatile semiconductor memory device 20 during a unit test as the NAND flash memory can be improved. Moreover, the nonvolatile semiconductor memory device 20 can increase the number of the blocks BLK that can be used by the controller 10 by using a part of the defective blocks as the selected block(s).

Second Embodiment

Figure 14:
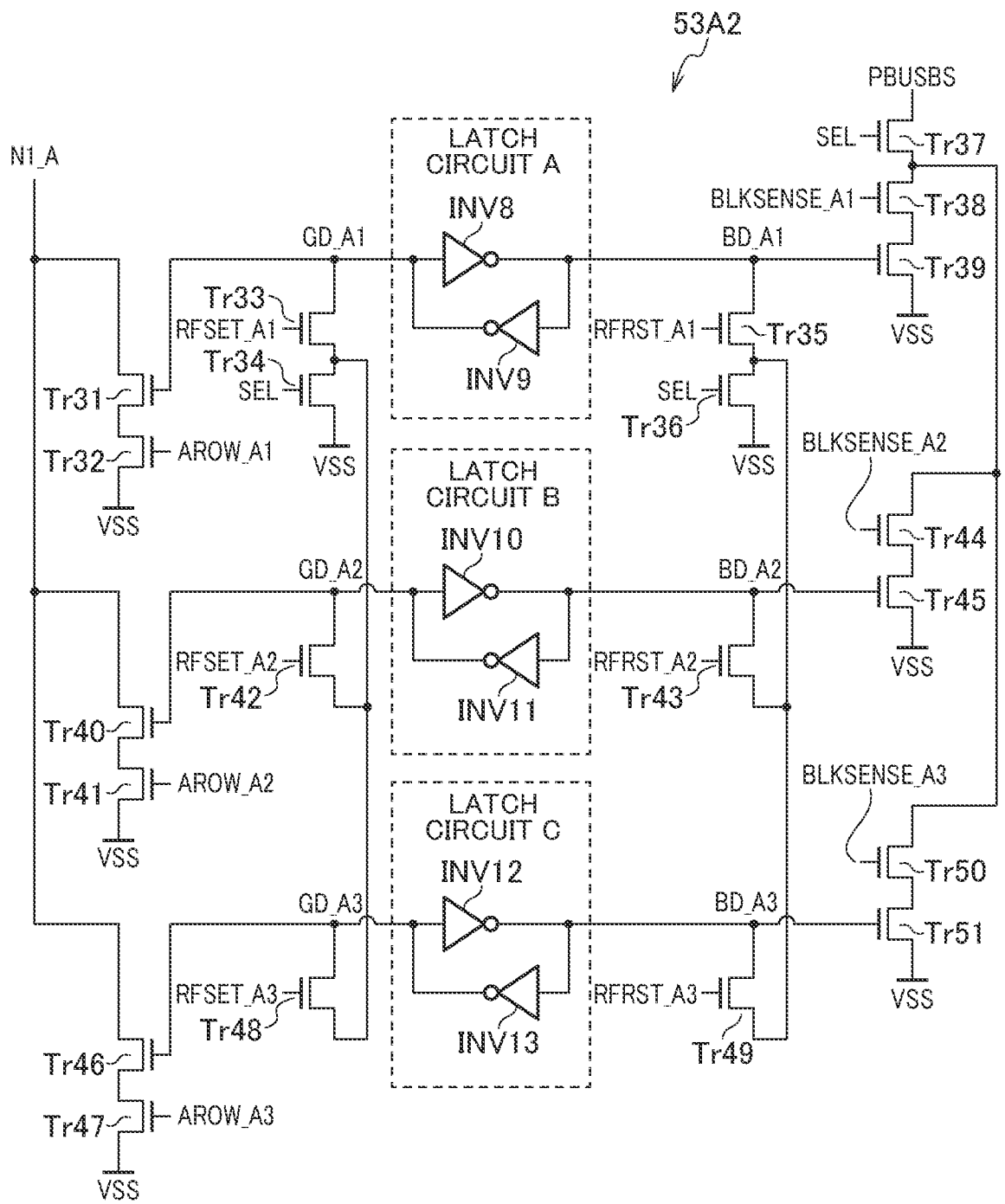
FIG. 14 is a diagram illustrating an example of a circuit configuration of a defective block flag circuit according to a second embodiment.

FIG. 14 illustrates an example of a circuit configuration of a defective block flag circuit 53 in a nonvolatile semiconductor memory device 20 according to a second embodiment. FIG. 14 illustrates a configuration of the defective block flag circuit 53A2 corresponding to a block BLK0 as an example of the defective block flag circuit 53. The defective block flag circuit 53 in the nonvolatile semiconductor memory device 20 according to the second embodiment has three-bit defective block flag data which is an example of the multi-level data.

(Example of Circuit Configuration of Defective Block Flag Circuit According to Second Embodiment)

The defective block flag circuit 53A2 includes n channel MOS transistors Tr31 to Tr51 and inverters INV8 to INV13, as illustrated in FIG. 14.

In addition to, for example, the configuration of the defective block flag circuit 53A according to the first embodiment, the defective block flag circuit 53A2 further includes: a latch circuit C, which is an example of a third latch circuit; a third data set unit configured to set, to the latch circuit C, information indicating that it is a defective block; a third data reset unit configured to reset, from the latch circuit C, information indicating that it is a defective block; a fifth transistor group configured to transfer an "L" level to the node N1_A; and a sixth transistor group for sensing the information of the latch circuit C.

As illustrated in FIG. 14, in the defective block flag circuit 53A2, a configuration composed of the n channel MOS transistors Tr31 to Tr45 and the inverters INV8 to INV11 is the same as the configuration composed of the n channel MOS transistors Tr11 to Tr25 and the inverters INV4 to INV7 of the defective block flag circuit 53A according to the first embodiment.

The n channel MOS transistors Tr46 and Tr47 are connected in series to each other between the node N1_A and the voltage VSS. More specifically, a first terminal of n channel MOS transistor Tr46 is connected to the node N1_A, and a second terminal of the n channel MOS transistor Tr47 is connected to the voltage VSS. The node GD_A3 is supplied to a gate of the n channel MOS transistor Tr46. Furthermore, the signal AROW_A3 is supplied to the n channel MOS transistor Tr47. That is, when the node GD_A3 and the signal AROW_A3 are at the "H" level, the node N1_A is turned to the "L" level. In the following description, when the node GD_A3 and the signal AROW_A3 are at the "H" level, the n channel MOS transistors Tr46 and Tr47 that transfer the "L" level to the node N1_A are referred to as a "fifth transistor group."

The inverters INV12 and INV13 are cross-connected to each other to compose the third latch circuit. More specifically, the inverter INV12 includes an input terminal connected to the node GD_A3 and an output terminal connected to a node BD_A3. Moreover, the inverter INV13 includes an input terminal connected to the node BD_A3, and an output terminal connected to the node GD_A3. That is, the node GD_A3 and the node BD_A3 have logical levels inverted from each other. Specifically, the node GD_A3 and the node BD_A3 have 1-bit defective block flag data. For example, the 1-bit defective block flag data indicates that the block BLK0 is not a defective block when the node GD_A3 and the node BD_A3 are respectively at the "H" level and the "L" level, and indicates that the block BLK0 is a defective block when the node GD_A3 and the node BD_A3 are respectively at "L" level and the "H" level. In the following description, an example of the third latch circuit where the inverters INV12 and INV13 are cross-connected to each other is also referred to as a "latch circuit C."

The n channel MOS transistor Tr48 includes a first terminal connected to the node GD_A3, a second terminal connected to the first terminal of the n channel MOS transistor Tr34, and the gate connected to a signal RFSET_A3.

The node RFSET_A3 is a node where a signal for setting information indicating that the block BLK0 is a defective block to the latch circuit C is transferred. More specifically, when the node RFSET_A3 is at the "H" level, the "L" level is transferred to the node GD_A3 and the information indicating that the block BLK0 is a defective block is set to the latch circuit C in the defective block flag circuit 53A. In the following description, the n channel MOS transistor Tr48 configured to set the information indicating that it is a defective block to the latch circuit C are referred to as a "third data set unit."

The n channel MOS transistor Tr49 includes a first terminal connected to the node BD_A3, a second terminal connected to the first terminal of the n channel MOS transistor Tr36, and the gate connected to a signal RFRST_A3.

The node RFRST_A3 is a node where a signal for resetting information indicating that the block BLK0 is a defective block from the latch circuit C is transferred. More specifically, when the node RFSET_A3 is at the "H" level, the "L" level is transferred to the node GD_A3 and the information indicating that the block BLK0 is not a defective block is reset to the latch circuit C in the defective block flag circuit 53A. In the following description, the n channel MOS transistor Tr49 configured to reset the information indicating that it is a defective block from the latch circuit C are referred to as a "third data reset unit."

The n channel MOS transistors Tr50 and Tr51 are connected in series to each other between the second terminal of the n channel MOS transistor Tr38 and the voltage VSS. More specifically, a first terminal of the n channel MOS transistor Tr50 is connected to the second terminal of the n channel MOS transistor Tr37, and a second terminal of the n channel MOS transistor Tr51 is connected to the voltage VSS.

A node BLKSENSE_A3 is supplied to a gate of the n channel MOS transistor Tr50. Moreover, the node BD_A3 is supplied to a gate of the n channel MOS transistor Tr51. The node BLKSENSE_A3 is a node used for determination of whether or not to target the information of the latch circuit C. In the following description, the n channel MOS transistors Tr50 and Tr51 used for sensing the information of the latch circuit C are referred to as a "sixth transistor group."

As described above, in accordance with the second embodiment, the defective block flag circuit 53 can includes the latch circuit A, the latch circuit B, and the latch circuit C which are respectively examples of the first latch circuit, the second latch circuit, and the third latch circuit, and can have the 3-bit defective block flag data which is an example of the multi-level data. Namely, the defective block flag circuit 53 can select the defective block flag data by registering the information of the three test divisions, which is the defective block flag data, and can use the non-selected block BLK registered as the defective block by switching the non-selected block BLK to the selected block BLK. In addition, an operation in which the defective block flag circuit 53 switches the state from the non-selected block BLK registered as the defective block to the selected block BLK will be described later.

(Operation Example of Cell Test)

Next, an example of an operation of a cell test of the defective block flag circuit 53 according to the second embodiment will now be described. Specifically, the defective block flag circuit 53 sets defective block flag data of three cell test results, in 3-bit defective block flag data. The first is one bit latched in the latch circuit, which is a 3-bit cell test result which is, for example, the TLC. The second is one bit latched in the latch circuit B, which is a 3-bit TLCtPROG cell test result, which is, for example, the TLC. The third is one bit latched in the latch circuit C, which is a 1-bit cell test result, which is, for example, the SLC. In the following description, the 3-bit cell test which is the TLC mode is referred to as a TLC cell test. The term TLCtPROG used herein means time (i.e., write latency) required to write data from the input buffer to the memory cell array 21.

Figure 15A:
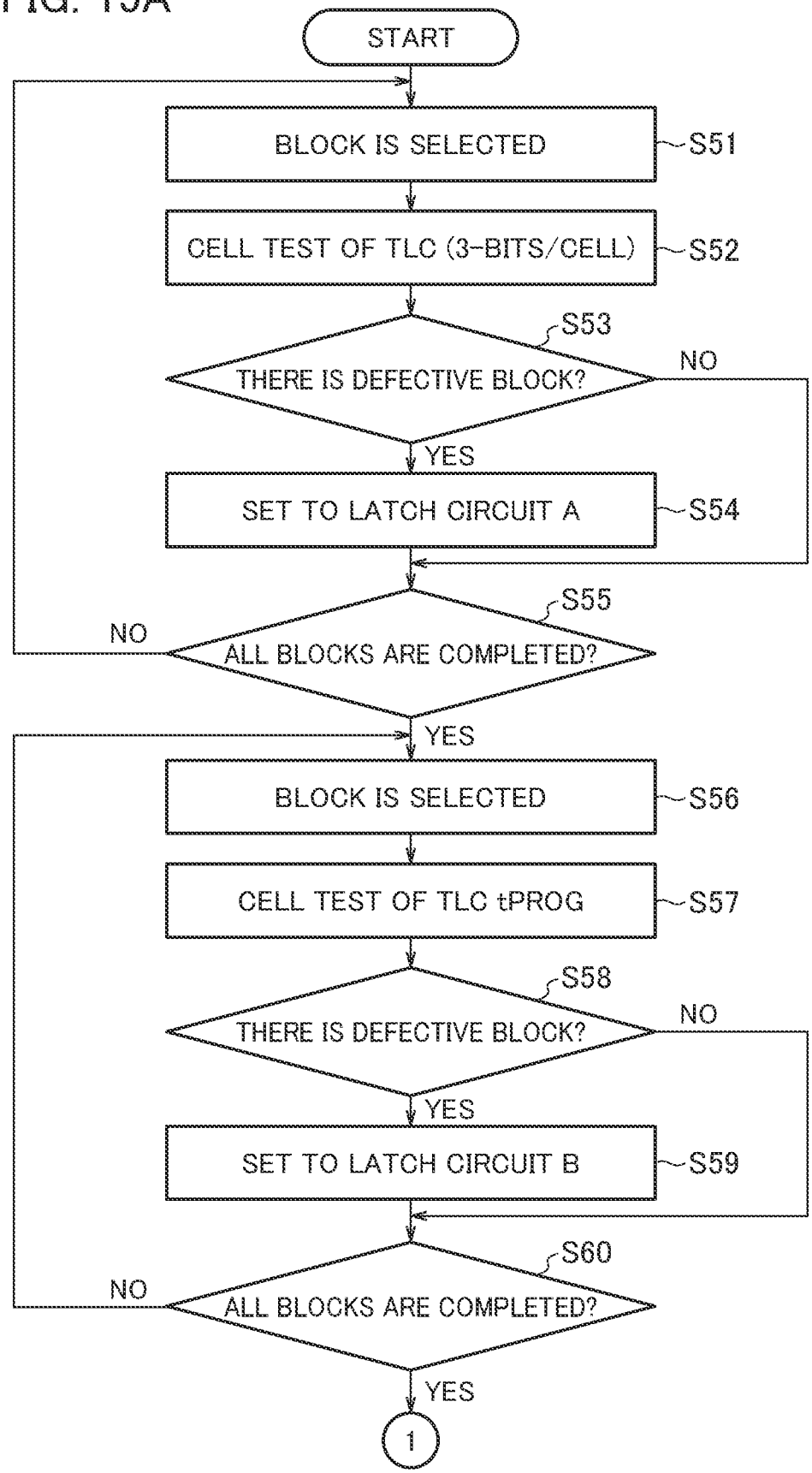
FIG. 15A is a flow chart illustrating an operation example of a cell test of a TLC (3 bits/cell), a TLC tPROG, and the SLC according to the second embodiment. (Phase 1)
Figure 15B:
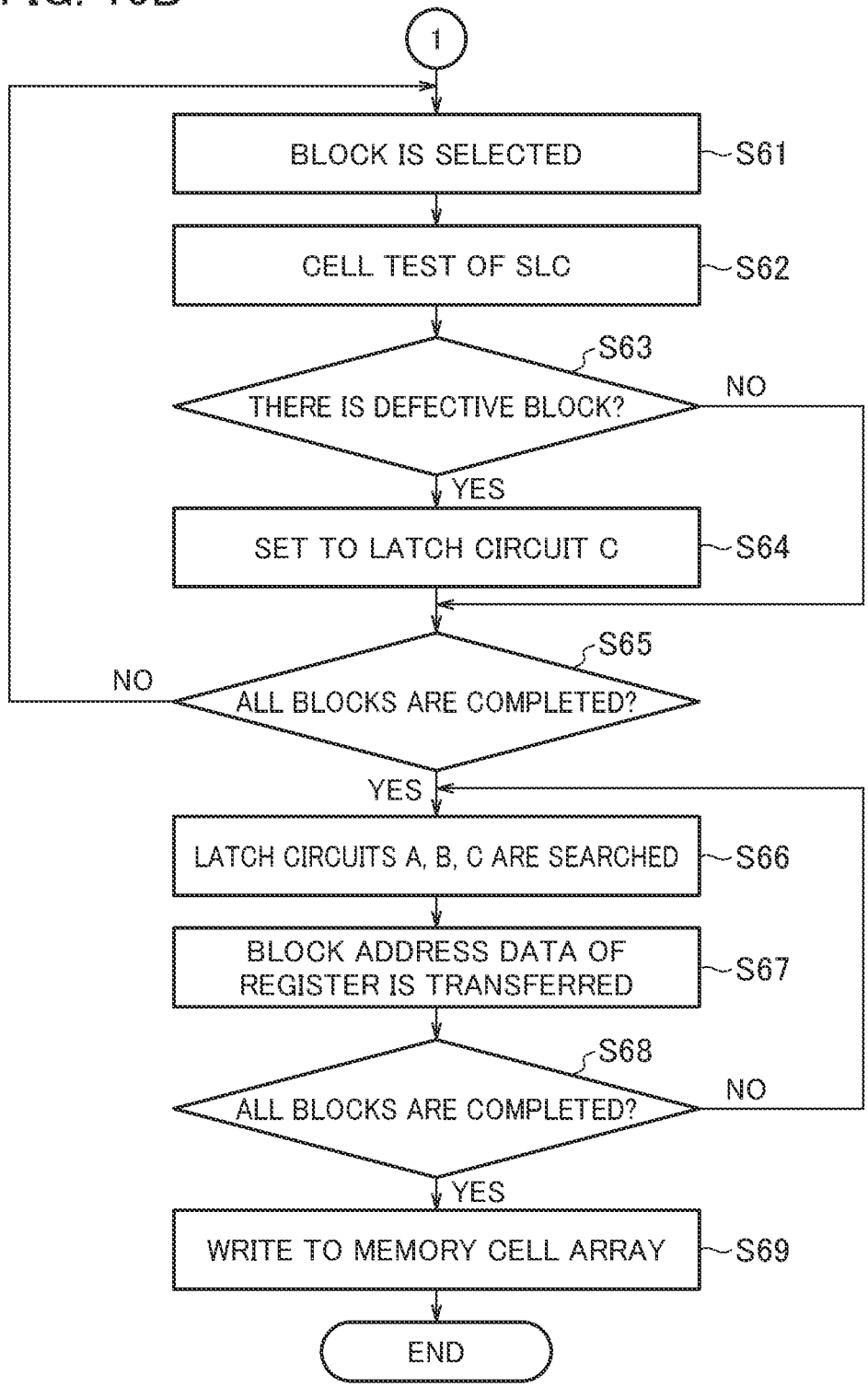
FIG. 15B is a flow chart illustrating an operation example of the cell test of the TLC, the TLC tPROG, and the SLC according to the second embodiment. (Phase 2)

An example of an operation of a cell test of the nonvolatile semiconductor memory device 20 according to the second embodiment is represented as illustrated in FIGS. 15A and 15B.

As mentioned above, the respective latch circuits in the defective block flag circuit 53 register the respective defective block flags of the cell tests in the respective one bit data. That is, since the block decoder 52 according to the second embodiment has 3-bit defective block flag data, which is written to the memory cell array 21 with eight values. Alternatively, the 1-bit defective block flag data of each cell test may also be written to the memory cell array 21 with two values. However, it is not actually limited to these examples.

In Step S51, the row decoder 28 receives a row address in the address ADD from the register 24 and selects a target block BLK on the basis of a block address in the received row address.

In Step S52, the row decoder 28 executes a TLC cell test with respect to the target block BLK.

In Step S53, if the target block BLK is a defective block, the process executed by the row decoder 28 advances to Step S54. If the target block BLK is not a defective block, the process executed by the row decoder 28 advances to Step S55.

In Step S54, the row decoder 28 sets information of the target block BLK to the latch circuit A, which is an example of the first latch circuit.

In Step S55, if all the blocks BLK have already been selected, the process executed by the row decoder 28 advances to Step S56. On the other hand, if all the blocks BLK have already been selected, the process executed by the row decoder 28 returns to Step S51.

In Step S56, the row decoder 28 receives a row address in the address ADD from the register 24 and selects a target block BLK on the basis of a block address in the received row address.

In Step S57, the row decoder 28 executes a TLCtPROG cell test with respect to the target block BLK.

In Step S58, if the target block BLK is a defective block, the process executed by the row decoder 28 advances to Step S59. If the target block BLK is not a defective block, the process executed by the row decoder 28 advances to Step S60.

In Step S59, the row decoder 28 sets information of the target block BLK to the latch circuit B, which is an example of the second latch circuit.

In Step S60, if all the blocks BLK have already been selected, the process executed by the row decoder 28 advances to Step S61. On the other hand, if all the blocks BLK have already been selected, the process executed by the row decoder 28 returns to Step S56.

In Step S61, the row decoder 28 receives a row address in the address ADD from the register 24 and selects a target block BLK on the basis of a block address in the received row address.

In Step S62, the row decoder 28 executes an SLC cell test with respect to the target block BLK.

In Step S63, if the target block BLK is a defective block, the process executed by the row decoder 28 advances to Step S64. If the target block BLK is not a defective block, the process executed by the row decoder 28 advances to Step S65.

In Step S64, the row decoder 28 sets information of the target block BLK to the latch circuit C, which is an example of the third latch circuit. More specifically, the row decoder 28 turns the node RFSET_A3 to the "H" level by the defective block flag circuit 53A in the block decoder 52A of the target block BLK0, for example. The "L" level is transferred to the node GD_A3 by turning the node RFSET_A3 to the "H" level in the defective block flag circuit 53A, and thereby information indicating that the block BLK0 is a defective block is set to the latch circuit C.

In Step S65, if all the blocks BLK have already been selected, the process executed by the row decoder 28 advances to Step S66. On the other hand, if all the blocks BLK have already been selected, the process executed by the row decoder 28 returns to Step S61.

In Step S66, the row decoder 28 searches the latch circuit A, the latch circuit B and the latch circuit C. Specifically, the row decoder 28 detects whether or not defective block flag data is set in the latch circuit A, the latch circuit B and the latch circuit C in order starting from the block BLK0.

In Step S67, the row decoder 28 transfers the block address in the register 24 to the sense amplifier module 29 if the defective block flag data is set in the latch circuit A, the latch circuit B, and /or the latch circuit C.

In Step S68, if all the blocks BLK have already been selected, the process executed by the row decoder 28 advances to Step S69. On the other hand, if all the blocks BLK have already been selected, the process executed by the row decoder 28 returns to Step S66.

In Step S69, the row decoder 28 transfers the defective block flag data in all the latch circuit A, the latch circuit B, the latch circuit C, and the block address data in the register 24 to the sense amplifier module 29, to be then written to the memory cell array 21.

As described above, in accordance with the second embodiment, the row decoder 28 can write the data of the plurality of defective block flags set respectively by the different cell tests into the memory cell array 21, in the cell tests of the nonvolatile semiconductor memory device 20. Specifically, in the cell test, the row decoder 28 writes the defective block flag data, which includes one bit that indicates the cell test result of, for example, the TLC (3 bit/cell), latched in the latch circuit A, one bit that indicates the cell test result of, for example, the TLC (3 bit/cell) tPRG, latched in the latch circuit B, and one bit that indicates the cell test result of, for example, the SLC, latched in the latch circuit C, into the memory cell array 21 with octal data.

Figures 16, 17:
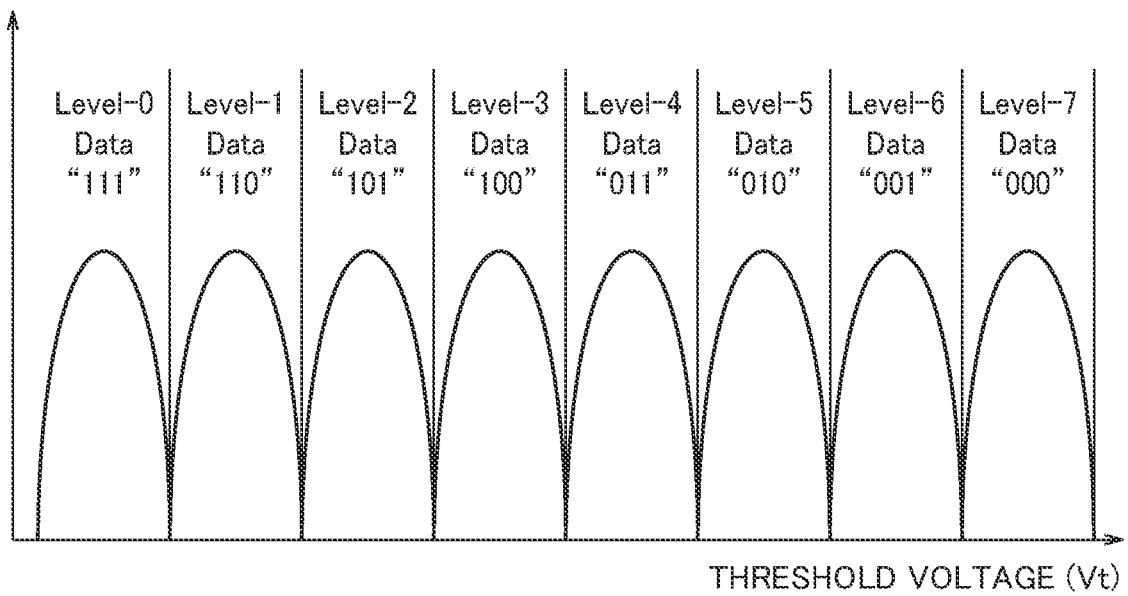
FIG. 16 is a schematic diagram illustrating a relationship between a cell distribution and a threshold of a TLC type memory cell.
FIG. 17 is a diagram illustrating an example of a table of a defective block address map according to the second embodiment.

FIG. 16 is a schematic diagram illustrating and a relationship between a cell distribution and a threshold where octal data (3 bit/cell) is written to the memory cell array 21. That is, such octal data can be written to the memory cell array 21 by being written to the block BLK at different threshold voltages. Specifically, FIG. 16 illustrates, for example, that with respect to the cell distribution, Data "111" is the threshold voltage level Level-0, Data "110" is the threshold voltage level Level-1, Data "101" is the threshold voltage level Level-2, Data "100" is the threshold voltage level Level-3, Data "011" is the threshold voltage level Level-4, Data "010" is the threshold voltage level Level-5, Data "001" is the threshold voltage level Level-6, and Data "000" is the threshold voltage level Level-7.

FIG. 17 illustrates an address map of the defective block flag data. This address map is an example of the defective block flag data written to the memory cell array 21 during the operation (S51 to S69) of the above-mentioned cell tests, for example.

As illustrated in FIG. 17, a region A of the defective block flag data is one bit latched in the latch circuit A and is a result of the TLC cell test, for example. Moreover, a region B of the defective block flag data is one bit latched in the latch circuit B and is a result of the TLCtPROG cell test, for example. Moreover, a region C of the defective block flag data is one bit latched in the latch circuit C and is a result of the SLC cell test, for example. That is, in accordance with a result of each of the TLC cell test, the TLCtPROG cell test, and the SLC cell test, "1" is set to a block corresponding to a block address (block BLK0, block BLK1, . . . ) which is a defective block.

In FIG. 17, "0" indicates that the block corresponding to the block address is normal. Moreover, "1" indicates that the block corresponding to the block address is failure. That is, for example, the block BLK0 is normal in each of the TLC cell test, the TLCtPROG, and the SLC cell test.

FIG. 18 is a diagram illustrating an example of a relationship between defective block flag data and a determination thereof. In accordance with the second embodiment, as illustrated in FIG. 18, the nonvolatile semiconductor memory device 20 can a non-selected block BLK as a selected block BLK, on the basis of a result of an TLC cell test indicated by one bit, which is the region A of the defective block flag, a result of the TLCtPROG cell test indicated by the one bit, which is the region B of the defective block flag, and a result of the SLC cell test indicated by the one bit, which is the region C of the defective block flag.

That is, in FIG. 18, the block BLK in which the result of the TLC cell test is failure but the result of the SLC cell test is normal cannot be used as the TLC but can be used as the SLC (i.e., is "available as C"). Moreover, for example, the block BLK in which the result of each of the TLC cell test and the SLC cell test is normal and the result of the TLCtPROG cell test is failure cannot be used as the TLC but can be used under a condition where the TLCtPROG time may be relatively longer (i.e., is "available as B"). However, it is not actually limited to these examples.

(Operation Example of Power On Reset)

Next, an example of a power on reset operation of the defective block flag circuit 53 according to the second embodiment will now be described.

Figure 19:
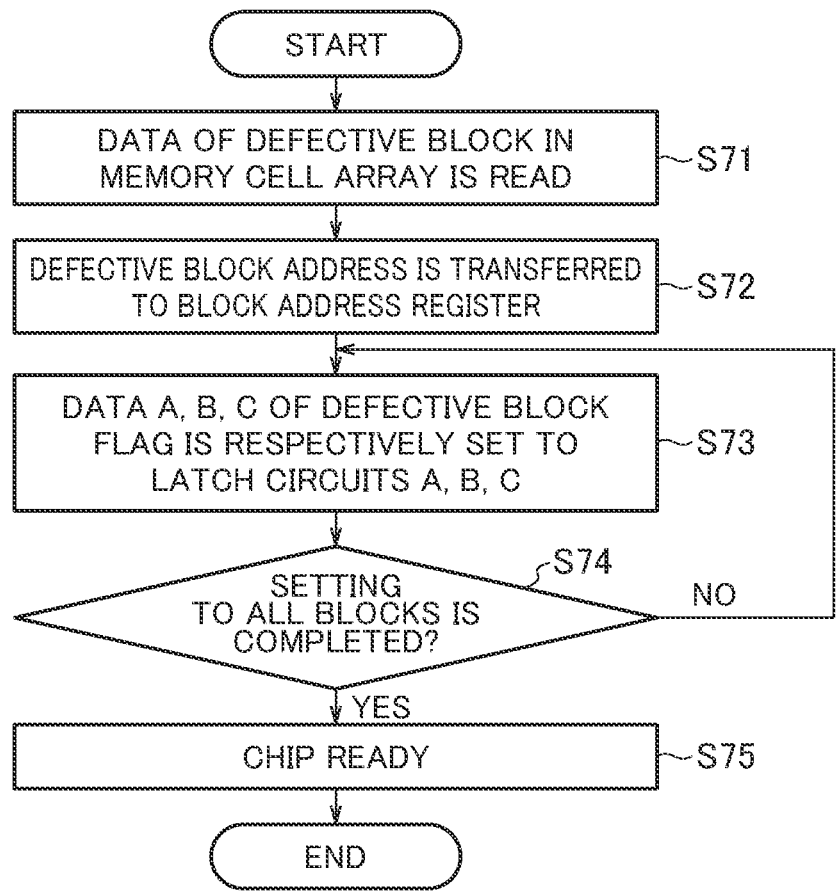
FIG. 19 is a flow chart illustrating an operation example of a power on reset process according to the second embodiment.

FIG. 19 illustrates an example of a power on reset operation of the nonvolatile semiconductor memory device 20 according to the second embodiment. As a matter of convenience of explanation, an operating method for, for example, setting a flag in the power on reset process will now be described.

In the nonvolatile semiconductor memory device 20, when it is detected that a power source is turned on, the sequencer 25 executes a power on reset process as an initialization operation.

In this power on reset process, the defective block address stored in the memory cell array 21 is read and is set to one of or each of the latch circuit A, the latch circuit B, and the latch circuit C.

In Step S71, the sequencer 25 reads defective block data from the memory cell array 21 by means of the sense amplifier module 29.

In Step S72, the sequencer 25 senses the data of the defective block address read by the sense amplifier module 29, and transfers the sensed and read defective block data to the register 24.

In Step S73, the row decoder 28 receives a row address in the address ADD from the register 24 and sets the defective block flag data to the latch circuit A, the latch circuit B, and the latch circuit C on the basis of the block address in the received row address. Specifically, the row decoder 28 sets defective block flag data in the latch circuit A, the latch circuit B, and the latch circuit C in order starting from the block BLK0. Furthermore, the row decoder 28 sets a block in which data of each of the latch circuit A, the latch circuit B, and the latch circuit C are "0", i.e., block in which the data in each of the result of the TLC cell test, the result of the TLCtPROG cell test, and the result of the SLC cell test are completely normal, as a selected block BLK, and sets the other blocks as a non-selected block BLK.

In Step S74, if all the blocks BLK have already been selected, the process executed by the row decoder 28 advances to Step S75. On the other hand, if all the blocks BLK have already been selected, the process executed by the row decoder 28 returns to Step S73.

In Step S75, when the sequencer 25 selects all the blocks BLK, the nonvolatile semiconductor memory device 20 becomes accessible chip ready state and can accept commands from the controller 10.

As described above, in accordance with the second embodiment, the row decoder 28 completes the setting of the plurality of defective block flag data to the latch circuit A, the latch circuit B, and the latch circuit C, in the power on reset process of the nonvolatile semiconductor memory device 20. The low decoder 28 completes the setting of the data of the plurality of defective block flags in the latch circuit A, the latch circuit B, and the latch circuit C, so that a block BLK corresponding to the defective block addresses determined to be defective in the different cell tests are made into the non-selected block BLK. That is, a row decoder 28 switches a block determined to be a defective block to the non-selected block and switches a block determined not to be a defective block to the selected block, on the basis of the multi-level data. That is, each of the blocks BLK will become the non-selected block BLK if the defective block flag thereof indicates that it is failure.

(Operation Example of SLC Buffer)

Next, an example of an operation of the SLC buffer, which is an example of a first command of the defective block flag circuit 53 according to the second embodiment will now be described. The block BLK can be used exclusively as the SLC even if a result of one of the different cell tests, the TLC cell test indicated by the one bit of the region A of the defective block flag, is failure, but a result of the other SLC cell test, indicated by the one bit of the region C of the defective block flag, is normal, as illustrated in FIG. 18. Namely, after the power on reset process, a non-selected block BLK can be switched to a selected block, on the basis of a result of the TLC cell test indicated by one bit, which is the region A of the defective block flag, a result of the TLCtPROG cell test indicated by one bit, which is the region B of the defective block flag and, a result of the SLC cell test indicated by one bit, which is the region C of the defective block flag, when using the SLC buffer, which is, for example, the first command, in response to a command from the controller 10. In addition, the operating method for switching the non-selected block BLK to the selected block may be executed in response to not only the command from the controller 10 but also by the sequencer 25 which reads a specific command register from the register 24, for example. However, it is not actually limited to these examples.

Figure 20A:
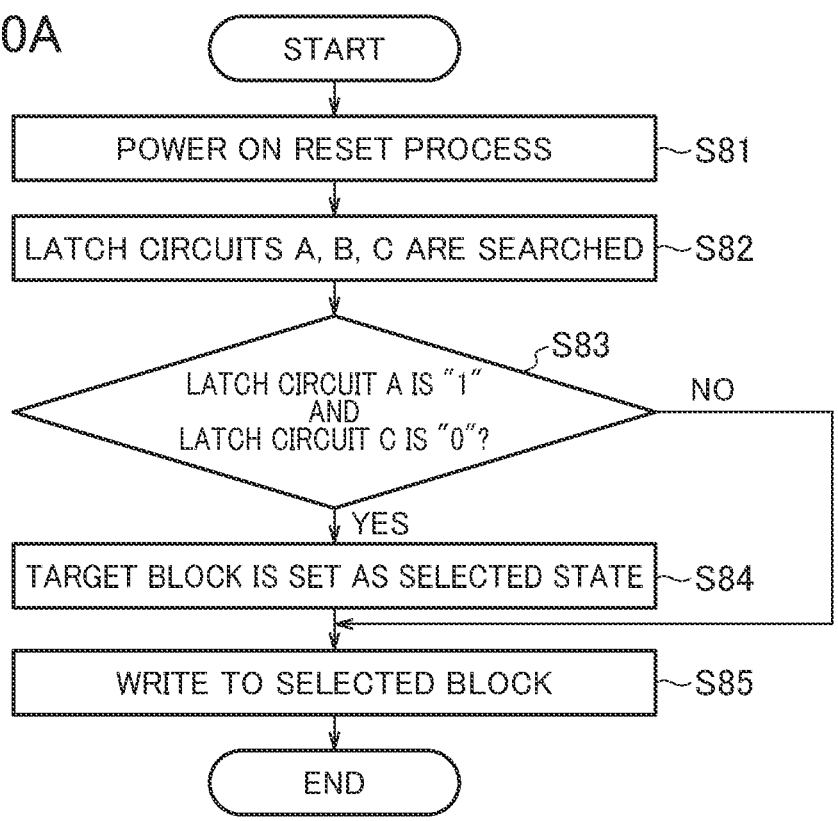
FIG. 20A is a flow chart illustrating an operation example of an SLC buffer according to the second embodiment.

FIG. 20A illustrates an example of an operation of the SLC buffer in the nonvolatile semiconductor memory device 20 according to the second embodiment. For example, the following describes an operation of the SLC buffer at the time when a power is turned on and the SLC buffer is used in response to a command from the controller 10 after the power on reset process.

In Step S81, the sequencer 25 executes a power on reset process when the power is turned on.

In Step S82, the row decoder 28 searches the latch circuit A, the latch circuit B and the latch circuit C. Specifically, the row decoder 28 detects whether or not defective block flag data is set in the latch circuit A, the latch circuit B, and the latch circuit C in order starting from the block BLK0, by means of the block decoder 52.

In Step S83, the row decoder 28 extracts a defective block in which the defective block flag of the latch circuit A is "1" and the defective block flag of the latch circuit C is "0" from the defective block address, and the process advances to Step S84 if it is a target defective block of this condition. The row decoder 28 extracts a defective block in which the defective block flag of the latch circuit A is "1" and the defective block flag of the latch circuit C is "0" from the defective block address, and the process advances to Step S85 if it is not a target defective block of this condition.

In Step S84, the row decoder 28 switches the target defective block from the non-selected block to the selected block. More specifically, the row decoder 28 provides the "H" level signal to the node BLKSEL when the block decoder determines that the target block BLK is the selected block on the basis of the condition that the defective block flag of the latch circuit A is "1" and the defective block flag of the latch circuit C is "0."

In Step S85, the row decoder 28 decodes, by means of the block decoder 52, a block address signal received from the register 24 at the time of write, read, and erase operations, and executes write, read, and erase operations with respect to the selected block. That is, the row decoder 28 executes the write operation to the memory cell array 21.

As described above, in accordance with the second embodiment, the row decoder 28 is configured to switch the target defective block from the non-selected block to the selected block in response to the command from the register, on the basis of the multi-level data. The low decoder 28, on the basis of the data of the plurality of defective block flags in the latch circuit A, the latch circuit B, and the latch circuit C, switches the block BLK corresponding to the defective block addresses determined to be defective in the different from the non-selected block BLK to the selected block BLK. That is, the non-selected block BLK is switched to the selected block from the non-selected block BLK on the basis of the plurality of defective block flag data.

(Operation Example of TLC Write Mode)

Next, an example of operation of the TLC write mode which is an example of a second command of the defective block flag circuit 53 according to the second embodiment will now be described. The block BLK can be used exclusively as the TLC under a condition where the tPROG time may be relatively longer, even if a result of two of the different cell tests, the TLC cell test indicated by the one bit of the region A of the defective block flag, and the SLC cell test indicated by the one bit of the region C of the defective block flag, are normal, but a result of the other TLCtPROG cell test, indicated by the one bit of the region B of the defective block flag, is failure, as illustrated in FIG. 18. Namely, after the power on reset process, a non-selected block BLK can be switched to a selected block, on the basis of a result of the TLC cell test indicated by one bit, which is the region A of the defective block flag, a result of the TLCtPROG cell test indicated by one bit, which is the region B of the defective block flag and, a result of the SLC cell test indicated by one bit, which is the region C of the defective block flag, when using the TLC write mode, which is, for example, the second command, in response to a command from the controller 10. In addition, the operating method for switching the non-selected block BLK to the selected block may be executed in response to not only the command from the controller 10 but also by the sequencer 25 which reads a specific command register from the register 24, for example. However, it is not actually limited to these examples.

Figure 20B:
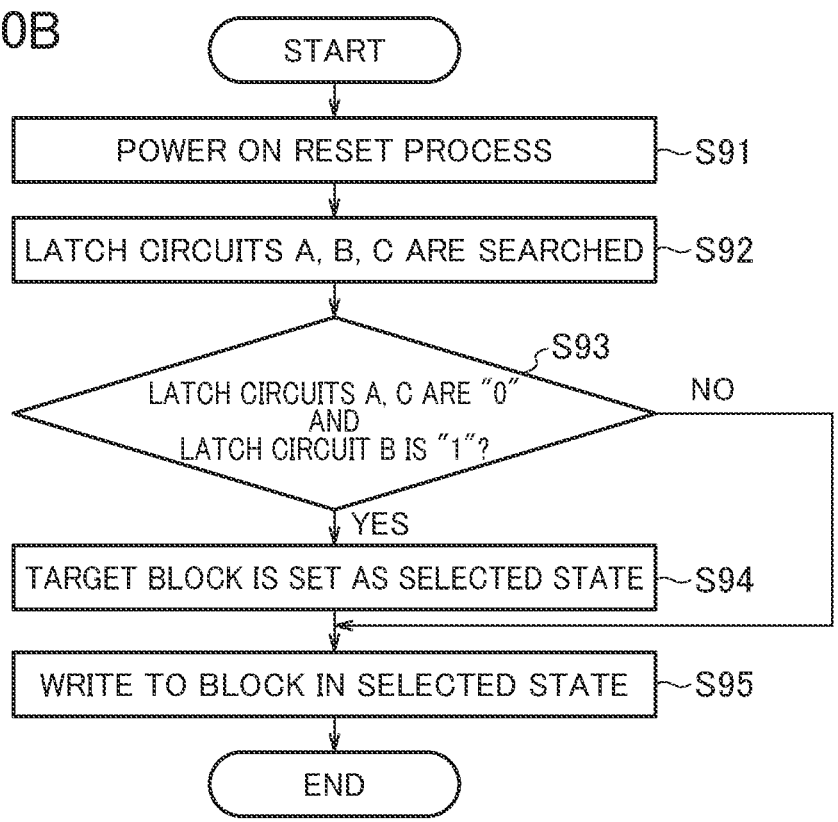
FIG. 20B is a flow chart illustrating an example of a TLC write-in operation.

FIG. 20B illustrates an example of an operation of the TLC write mode in the nonvolatile semiconductor memory device 20 according to the second embodiment. For example, the following describes an operation of the TLC write mode at the time when a power is turned on and the TLC write mode is used in response to the second command from the controller 10 after the power on reset process.

In Step S91, the sequencer 25 executes a power on reset process when the power is turned on.

In Step S92, the row decoder 28 searches the latch circuit A, the latch circuit B and the latch circuit C. Specifically, the row decoder 28 detects whether or not defective block flag data is set in the latch circuit A, the latch circuit B, and the latch circuit C in order starting from the block BLK0, by means of the block decoder 52.

In Step S93, the row decoder 28 extracts a defective block in which the defective block flag of each of the latch circuits A and C is "0" and the defective block flag of the latch circuit B is "1" from the defective block address, and the process advances to Step S94 if it is a target defective block of this condition. The row decoder 28 extracts a defective block in which the defective block flag of each of the latch circuits A and C is "0" and the defective block flag of the latch circuit B is "1" from the defective block address, and the process advances to Step S95 if it is not a target defective block of this condition.

In Step S94, the row decoder 28 switches the target defective block from the non-selected block to the selected block. More specifically, the row decoder 28 provides the "H" level signal to the node BLKSEL when the block decoder determines that the target block BLK is the selected block on the basis of the condition that the defective block flag of each of the latch circuits A and C is "0" and the defective block flag of the latch circuit B is "1." That is, the row decoder 28 switches the target defective block from the non-selected block to the selected block.

In Step S95, the row decoder 28 decodes, by means of the block decoder 52, a block address signal received from the register 24 at the time of write, read, and erase operations, and executes write, read, and erase operations with respect to the selected block. That is, the row decoder 28 executes the write operation to the memory cell array 21.

As described above, in accordance with the second embodiment, the row decoder 28 is configured to switch the target defective block from the non-selected block to the selected block in response to the command from the register, on the basis of the multi-level data. More specifically, for example, in the process using the TLC write mode which is an example of the second command of the nonvolatile semiconductor memory device 20, the low decoder 28, on the basis of the data of the plurality of defective block flags in the latch circuit A, the latch circuit B, and the latch circuit C, switches the block BLK corresponding to the defective block addresses determined to be defective in the different from the non-selected block BLK to the selected block BLK. That is, the non-selected block BLK is switched to the selected block from the non-selected block BLK on the basis of the plurality of defective block flag data.

(Effects Produced from Second Embodiment)

In accordance with the second embodiment, the row decoder 28 includes the latch circuit A, the latch circuit B, and the latch circuit C, which are respectively examples of the first latch circuit, the second latch circuit, and the third latch circuit, in the block decoder for switching between the selected block BLK and the non-selected block BLK, and thereby can have 3-bit defective block flag data which is the example of the multi-level data. That is, the defective block flag circuit 53 registers the information of the three test divisions, which is the defective block flag data, and thereby can select the defective block flag data and use the non-selected block BLK registered as a defective block by being switched to the selected block BLK.

In accordance with the second embodiment, the row decoder 28 can classify the defective block, and can use a part of the defective blocks as a selected block in response to the first command from the controller 10, for example. Accordingly, a yield of the nonvolatile semiconductor memory device 20 during a unit test as the NAND flash memory can be improved. Moreover, the nonvolatile semiconductor memory device 20 can increase the number of the blocks BLK that can be used by the controller 10 by using a part of the defective blocks as the selected block(s).

In accordance with the second embodiment, the row decoder 28 can classify the defective block, and can use a part of the defective blocks as a selected block in response to the second command from the controller 10, for example. Accordingly, a yield of the nonvolatile semiconductor memory device 20 during a unit test as the NAND flash memory can be improved. Moreover, the nonvolatile semiconductor memory device 20 can increase the number of the blocks BLK that can be used by the controller 10 by using a part of the defective blocks as the selected block(s).

Third Embodiment

A circuit configuration of a defective block flag circuit 53 in the nonvolatile semiconductor memory device 20 according to the third embodiment is the same as the circuit configuration of the defective block flag circuit 53 in the nonvolatile semiconductor memory device 20 according to the second embodiment. The defective block flag circuit 53 in the nonvolatile semiconductor memory device 20 according to the third embodiment has three-bit defective block flag data which is an example of the multi-level data.

The defective block flag circuit 53 registers the information of the three test divisions, which is the defective block flag data, and thereby can select the defective block flag data and use the non-selected block BLK registered as a defective block by being switched to the selected block BLK. In addition, an operation in which the defective block flag circuit 53 switches the state from the non-selected block BLK registered as the defective block to the selected block BLK will be described later.

(Operation Example of Cell Test)

Next, an example of an operation of a cell test of the defective block flag circuit 53 according to the third embodiment will now be described. Specifically, the defective block flag circuit 53 sets defective block flag data of three cell test results, in 3-bit defective block flag data. The first bit is one bit latched in the latch circuit A, for example, illustrating a determination test result of 10-bit fail bit counts. The second bit is one bit latched in the latch circuit B, for example, illustrating a determination test result of 50-bit fail bit counts. The third bit is one bit latched in the latch circuit C, for example, illustrating a determination test result of 100-bit fail bit counts.

Figure 21A:
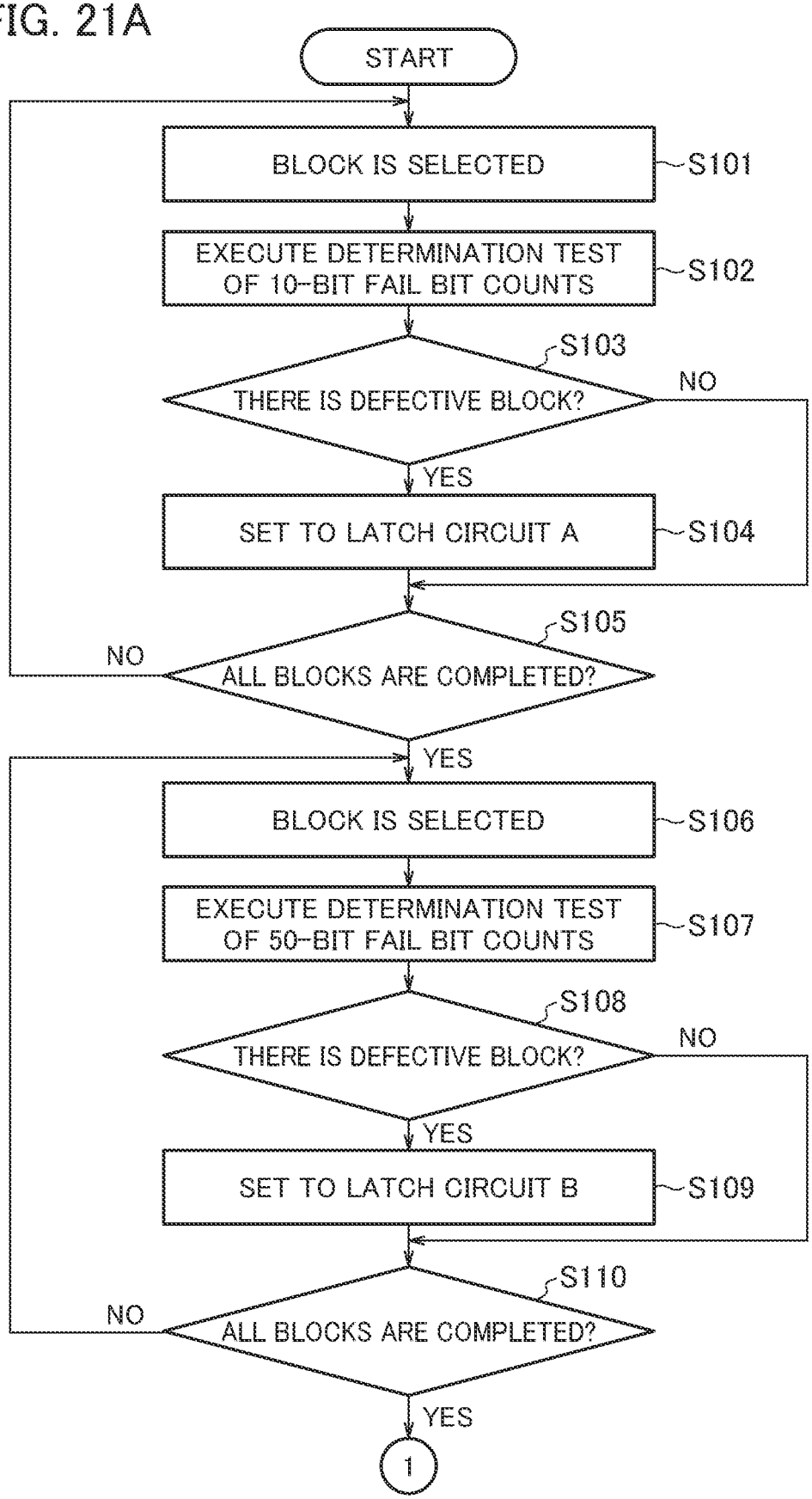
FIG. 21A is a flow chart illustrating an operation example of a determination test of 10-bit, 50-bit, and 100-bit fail bit counts according to a third embodiment. (Phase 1)

An example of an operation of a cell test of the nonvolatile semiconductor memory device 20 according to the third embodiment is represented as illustrated in FIGS. 21A and 21B.

As mentioned above, the respective latch circuits in the defective block flag circuit 53 register the respective defective block flags of the cell tests in the respective one bit data. That is, since the block decoder 52 according to the third embodiment has 3-bit defective block flag data, which is written to the memory cell array 21 with eight values. Alternatively, the 1-bit defective block flag data of each cell test may also be written to the memory cell array 21 with two values. However, it is not actually limited to these examples.

In Step S101, the row decoder 28 receives a row address in the address ADD from the register 24 and selects a target block BLK on the basis of a block address in the received row address.

In Step S102, the row decoder 28 executes a determination test of 10-bit fail bit counts with respect to the target block BLK.

In Step S103, if the target block BLK is a defective block, the process executed by the row decoder 28 advances to Step S104. If the target block BLK is not a defective block, the process executed by the row decoder 28 advances to Step S105.

In Step S104, the row decoder 28 sets information of the target block BLK to the latch circuit A, which is an example of a first latch circuit.

In Step S105, if all the blocks BLK have already been selected, the process executed by the row decoder 28 advances to Step S106. On the other hand, if all the blocks BLK have already been selected, the process executed by the row decoder 28 returns to Step S101.

In Step S106, the row decoder 28 receives a row address in the address ADD from the register 24 and selects a target block BLK on the basis of a block address in the received row address.

In Step S107, the row decoder 28 executes a determination test of 50-bit fail bit counts with respect to the target block BLK.

In Step S108, if the target block BLK is a defective block, the process executed by the row decoder 28 advances to Step S109. If the target block BLK is not a defective block, the process executed by the row decoder 28 advances to Step S110.

In Step S109, the row decoder 28 sets information of the target block BLK to the latch circuit B, which is an example of a second latch circuit.

In Step S110, if all the blocks BLK have already been selected, the process executed by the row decoder 28 advances to Step S111. On the other hand, if all the blocks BLK have already been selected, the process executed by the row decoder 28 returns to Step S106.

In Step S111, the row decoder 28 receives a row address in the address ADD from the register 24 and selects a target block BLK on the basis of a block address in the received row address.

In Step S112, the row decoder 28 executes a determination test of 100-bit fail bit counts with respect to the target block BLK.

In Step S113, if the target block BLK is a defective block, the process executed by the row decoder 28 advances to Step S114. If the target block BLK is not a defective block, the process executed by the row decoder 28 advances to Step S115.

In Step S114, the row decoder 28 sets information of the target block BLK to the latch circuit C, which is an example of the third latch circuit.

In Step S115, the row decoder 28 receives the row address in the address ADD from the register 24, and if all the blocks BLK have already been selected on the basis of the block address in the received row address, the process executed by the row decoder 28 advances to Step S116.

The row decoder 28 receives the row address in the address ADD from the register 24, and if all the blocks BLK have already been selected on the basis of the block address in the received row address, the process executed by the row decoder 28 returns to Step S111.

In Step S116, the row decoder 28 searches the latch circuit A, the latch circuit B and the latch circuit C.

In Step S117, the row decoder 28 transfers the block address in the register 24 to the sense amplifier module 29 if the defective block flag data is set in the latch circuit A, the latch circuit B, and /or the latch circuit C.

In Step S118, if all the blocks BLK have already been selected, the process executed by the row decoder 28 advances to Step S119. On the other hand, if all the blocks BLK have already been selected, the process executed by the row decoder 28 returns to Step S116.

In Step S119, the row decoder 28 transfers the defective block flag data in all the latch circuit A, the latch circuit B, the latch circuit C, and the block address data in the register 24 to the sense amplifier module 29, to be then written to the memory cell array 21.

As described above, in accordance with the third embodiment, the row decoder 28 can write the data of the plurality of defective block flags set respectively by the different cell tests into the memory cell array 21, in the cell tests of the nonvolatile semiconductor memory device 20. Specifically, in the cell test, the row decoder 28 writes the defective block flag data, which includes one bit that indicates, for example, the determination test result of 10-bit fail bit counts latched in the latch circuit A, one bit that indicates, for example, the determination test result of 50-bit fail bit counts latched in the latch circuit B, and one bit that indicates, for example, the determination test result of 100-bit fail bit counts latched in the latch circuit C, into the memory cell array 21 with octal data.

FIG. 22 is a diagram illustrating an example of a relationship between defective block flag data and a determination thereof. In accordance with the third embodiment, the nonvolatile semiconductor memory device 20 can use a non-selected block BLK as a selected block BLK, on the basis of the determination test result of 10-bit fail bit counts indicated by one bit, which is the region A of the defective block flag, the determination test result of 50-bit fail bit counts indicated by the one bit, which is the region B of the defective block flag, and the determination test result of 100-bit fail bit counts indicated by the one bit, which is the region C of the defective block flag. That is, in the nonvolatile semiconductor memory device 20, as shown in FIG. 22, for example, the block BLK in which the determination test result of 100-bit fail bit counts is normal and the determination test result of 10-bit fail bit counts is failure can be used as a block BLK with a small amount of the fail bit counts (i.e., is "available as B"). Moreover, in the nonvolatile semiconductor memory device 20, as shown in FIG. 22, for example, the block BLK in which the determination test result of 100-bit fail bit counts is normal and the determination test result of 50-bit fail bit counts is failure can be used as a block BLK with a small amount of the fail bit counts (i.e., is "available as B"). However, it is not actually limited to these examples.

(Effects Produced from Third Embodiment)

In accordance with the third embodiment, as illustrated in FIG. 22, even if the determination test result of 100-bit fail bit counts is normal and the 10-bit determination test result of fail bit count or the determination test result of 50-bit fail bit counts is failure, the nonvolatile semiconductor memory device 20 can improve reliability by preferentially using the target block BLK as a block BLK with a small amount of the fail bit counts, for a block BLK that require high reliability.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array including a plurality of selected blocks and a plurality of non-selected blocks; and
    a row decoder including a block decoder configured to switch between the selected block and the non-selected block, wherein
    the block decoder comprises a defective block flag circuit including a plurality of latch circuits configured to store multi-level data, and
    the block decoder switches a block determined to be a defective block to a non-selected block and switches a block determined not to be a defective block to a selected block, on the basis of the multi-level data.

2. The nonvolatile semiconductor memory device according to claim 1, further comprising
    a register storing a command for executing a write operation, a read operation, and an erase operation, and information of a block address, wherein
    the row decoder switches the block from the non-selected block to the selected block, in response to the command from the register, on the basis of the multi-level data.

3. The nonvolatile semiconductor memory device according to claim 1, wherein
    the multi-level data is information of a defective block flag for each of a plurality of test memory divisions.

4. The nonvolatile semiconductor memory device according to claim 2, wherein
    the multi-level data is information of a defective block flag for each of a plurality of test memory divisions.

5. The nonvolatile semiconductor memory device according to claim 3, wherein
    the information of the defective block flag is information selected from the group of consisting of pass/fail information of cell tests, pass/fail determination information of a writing time of an input buffer, and a determination test of fail bit counts.

6. The nonvolatile semiconductor memory device according to claim 4, wherein
    the information of the defective block flag is information selected from the group of consisting of pass/fail information of cell tests, pass/fail determination information of a writing time of an input buffer, and a determination test of fail bit counts.

7. The nonvolatile semiconductor memory device according to claim 2, wherein
    the command includes a first command for executing a single-level cell buffer, which is 1-bit information, and a second command for executing a write operation of a triple-level cell, which is 3-bit information.

8. The nonvolatile semiconductor memory device according to claim 3, wherein
    the plurality of latch circuits include a first latch circuit and a second latch circuit, wherein
    information of a defective block flag of a first test division among the plurality of test memory divisions is set to the first latch circuit, and
    information of a defective block flag of a second test division among the plurality of test memory divisions is set to the second latch circuit.

9. The nonvolatile semiconductor memory device according to claim 8, wherein
    the row decoder switches the block from the non-selected block to the selected block on the basis of the multi-level data, the multi-level data including the information of the defective block flag of the first test division and the information of the defective block flag of the second test division.

10. The nonvolatile semiconductor memory device according to claim 8, wherein
    the information of the defective block flag of the first test division is information indicating whether or not an abnormality has occurred in the first test division, and
    the information of the defective block flag of the second test division is information indicating whether or not an abnormality has occurred in the second test division.

11. The nonvolatile semiconductor memory device according to claim 8, wherein
    the first test division is a cell test division for a multilevel cell, and
    the second test division is a cell test division for a single-level cell.

12. The nonvolatile semiconductor memory device according to claim 3, wherein
    the plurality of latch circuits include a first latch circuit, a second latch circuit, and a third latch circuit, wherein
    information of a defective block flag of a first test division among the plurality of test memory divisions is set to the first latch circuit,
    information of a defective block flag of a second test division among the plurality of test memory divisions is set to the second latch circuit, and
    information of a defective block flag of a third test division among the plurality of test memory divisions is set to the third latch circuit.

13. The nonvolatile semiconductor memory device according to claim 12, wherein
    the row decoder switches the block from the non-selected block to the selected block on the basis of the multi-level data, the multi-level data including the information of the defective block flag of the first test division, the information of the defective block flag of the second test division, and the information of the defective block flag of the third test division.

14. The nonvolatile semiconductor memory device according to claim 12, wherein
    the information of the defective block flag of the first test division is information indicating whether or not an abnormality has occurred in the first test division, the information of the defective block flag of the second test division is information indicating whether or not an abnormality has occurred in the second test division, and the information of the defective block flag of the third test division is information indicating whether or not an abnormality has occurred in the third test division.

15. The nonvolatile semiconductor memory device according to claim 12, wherein the first test division is a cell test division for a triple-level cell, the second test division is a test division of a time of a writing operation for the triple-level cell, and the third test division is a cell test division for a single-level cell.

16. An operating method of a nonvolatile semiconductor memory device, the operating method comprising:

by a row decoder, receiving a row address from a register;

setting multi-level data are to a plurality of latch circuits on the basis of the row address; and switching a block determined to be a defective block to a non-selected block and switching a block determined not to be a defective block to a selected block, on the basis of the multi-level data.

17. The operating method according to claim 16, wherein the multi-level data is information of a defective block flag for each of a plurality of test memory divisions.

18. The operating method according to claim 17, wherein the information of the defective block flag is information selected from the group of consisting of pass/fail information of cell tests, pass/fail determination information of a writing time of an input buffer, and a determination test of fail bit counts.

19. An operating method of a nonvolatile semiconductor memory device, the operating method comprising:

by a row decoder, detecting whether or not defective block flag data is set to a plurality of latch circuits in order starting from a top block, in response to a command stored in a register;

if detecting that the defective block flag data is set thereto, extracting a defective block flag data latched in the plurality of latch circuits from a defective block address; and if determining that a target block is a selected block on the basis of the defective block flag data, switching the target block from a non-selected block to a selected block, and executing a write operation to a memory cell array.

20. The operating method according to claim 19, wherein the command includes a first command for executing a single-level cell buffer, which is 1-bit information, and a second command for executing a write operation of a triple-level cell, which is 3-bit information.

* * * * *